US009413368B2

United States Patent
Ta et al.

(10) Patent No.: US 9,413,368 B2
(45) Date of Patent: Aug. 9, 2016

(54) AUTO FREQUENCY CONTROL CIRCUIT AND RECEIVER

(71) Applicant: KABUSHIKI KAISHA TOSHIBA, Minato-ku, Tokyo (JP)

(72) Inventors: Tuan Thanh Ta, Yokohama Kanagawa (JP); Hidenori Okuni, Yokohama Kanagawa (JP); Akihide Sai, Kawasaki Kanagawa (JP); Masanori Furuta, Odawara Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/974,922

(22) Filed: Dec. 18, 2015

(65) Prior Publication Data

US 2016/0182066 A1    Jun. 23, 2016

(30) Foreign Application Priority Data

Dec. 18, 2014 (JP) .................................. 2014-256366

(51) Int. Cl.
| | |
|---|---|
| H03D 3/02 | (2006.01) |
| H03L 7/099 | (2006.01) |
| H04L 27/26 | (2006.01) |
| H03L 7/093 | (2006.01) |
| H03D 3/00 | (2006.01) |
| H03L 7/18 | (2006.01) |

(52) U.S. Cl.
CPC ................ *H03L 7/099* (2013.01); *H03D 3/007* (2013.01); *H03L 7/093* (2013.01); *H03L 7/18* (2013.01); *H04L 27/2657* (2013.01)

(58) Field of Classification Search
CPC ........... H03L 7/093; H03L 7/099; H03L 7/18; H04L 27/2657; H03D 3/007
USPC .......... 329/323, 327, 315, 320, 318; 455/260, 455/255, 256; 375/344, 343
See application file for complete search history.

(56) References Cited

U.S. PATENT DOCUMENTS

| | | | |
|---|---|---|---|
| 5,883,930 A | 3/1999 | Fukushi | |
| 7,386,286 B2 * | 6/2008 | Petrovic | ................. H03D 3/007 329/323 |

FOREIGN PATENT DOCUMENTS

JP        2877198 B2      3/1999

* cited by examiner

*Primary Examiner* — Arnold Kinkead
(74) *Attorney, Agent, or Firm* — Holtz, Holtz & Volek PC

(57) ABSTRACT

According to an embodiment, an auto frequency control circuit includes a peak time detector, a first time shifter a zero-crossing time detector, and a second time shifter. The peak time detector detects, from the digital signal, a first time at which the digital signal exhibits one of a maximal value and a minimal value. The first time shifter adds or subtracts a first natural number multiple of the predetermined period to or from the first time. The zero-crossing time detector detects, from the digital signal, a second time at which the digital signal exhibits one of a positive zero-crossing and a negative zero-crossing. The second time shifter adds or subtracts the first natural number multiple of the predetermined period to or from the second time.

11 Claims, 13 Drawing Sheets

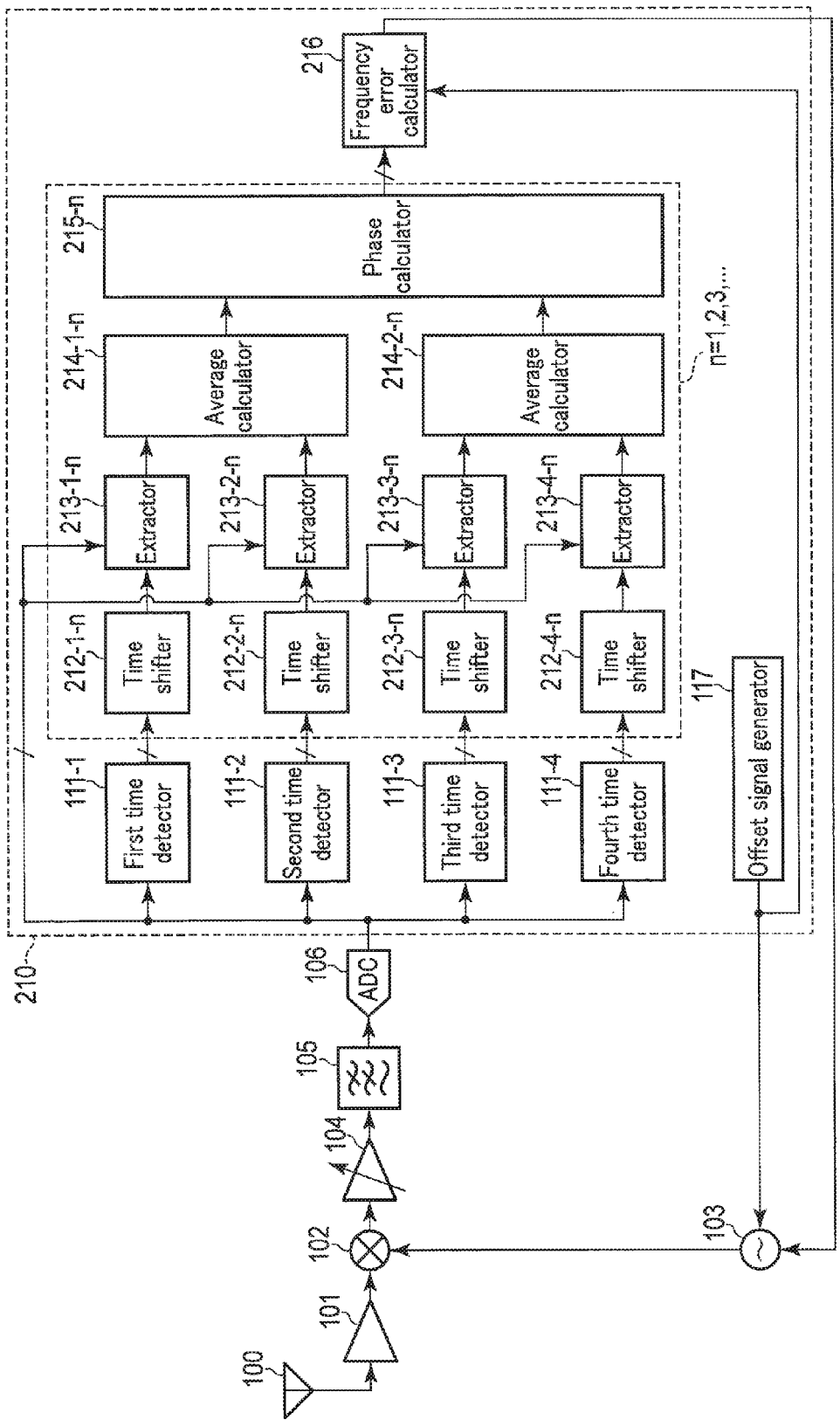
F I G. 4

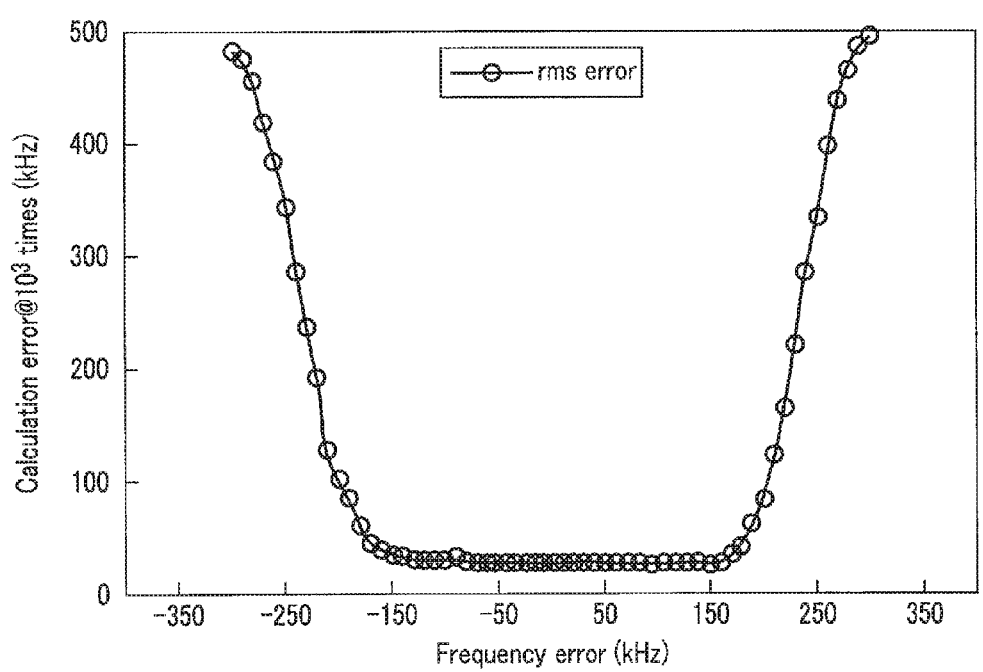
F I G. 6

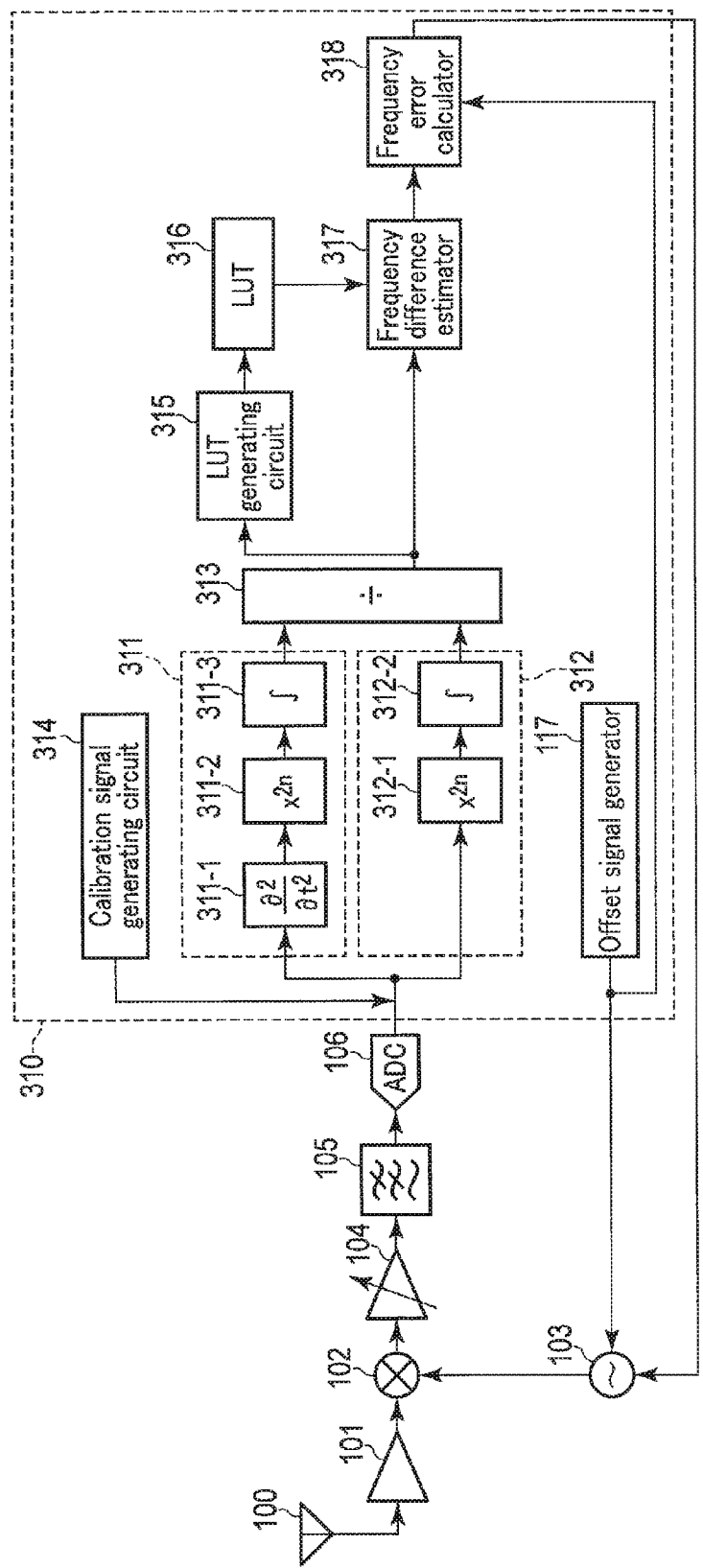
F I G. 7

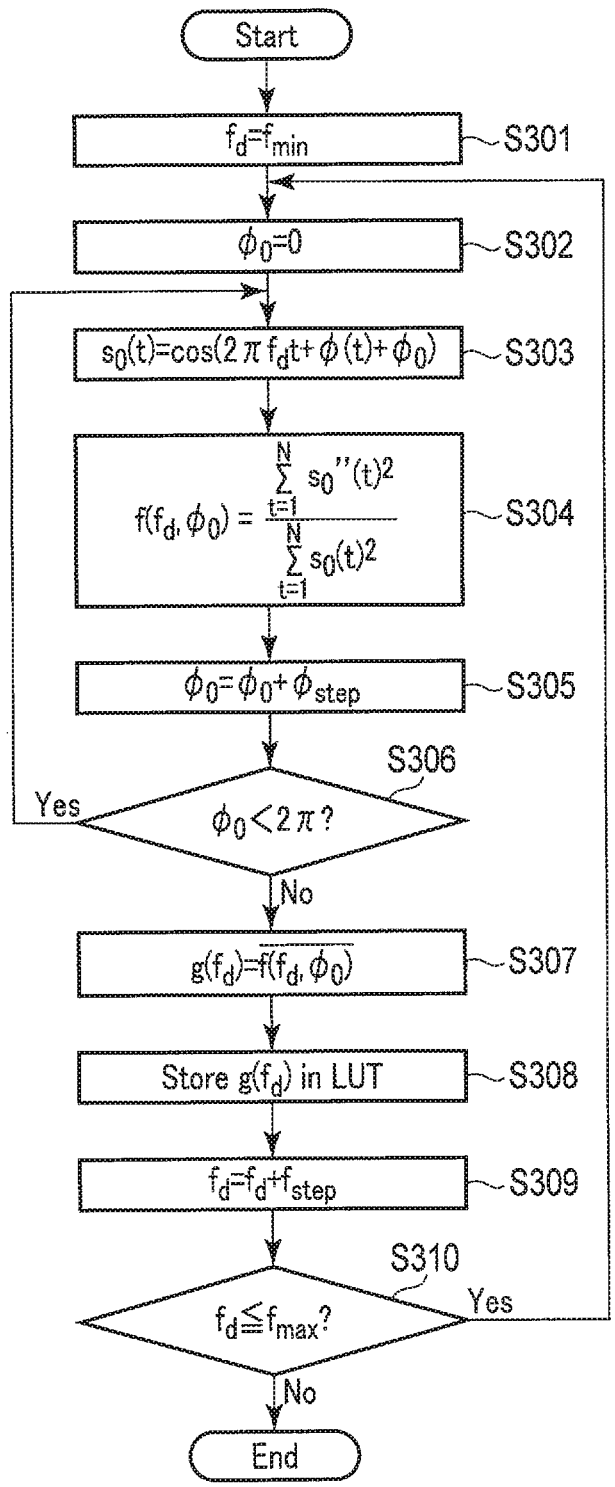
F I G. 8

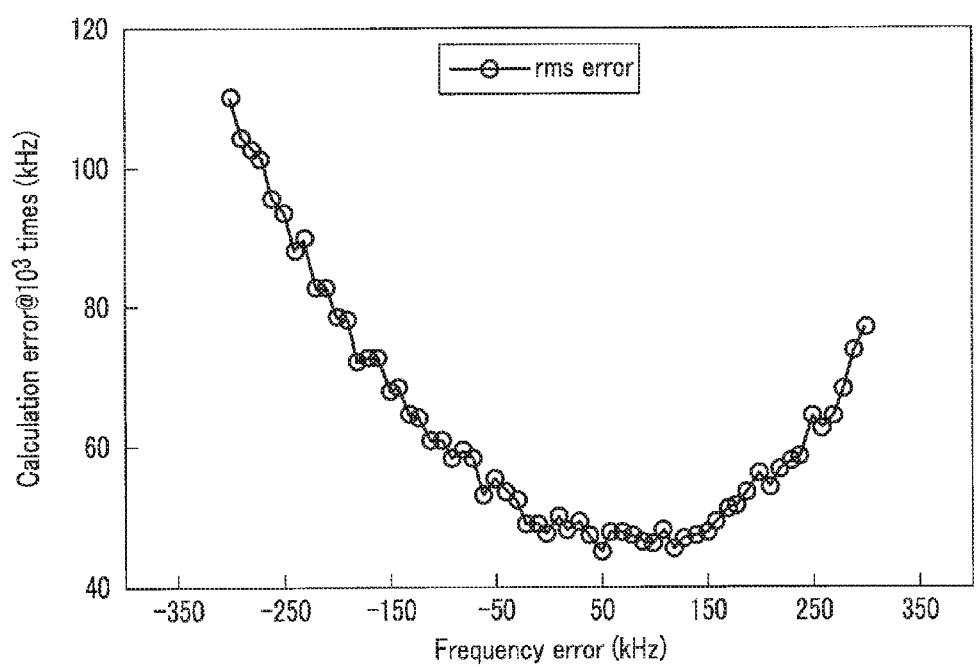
F I G. 11

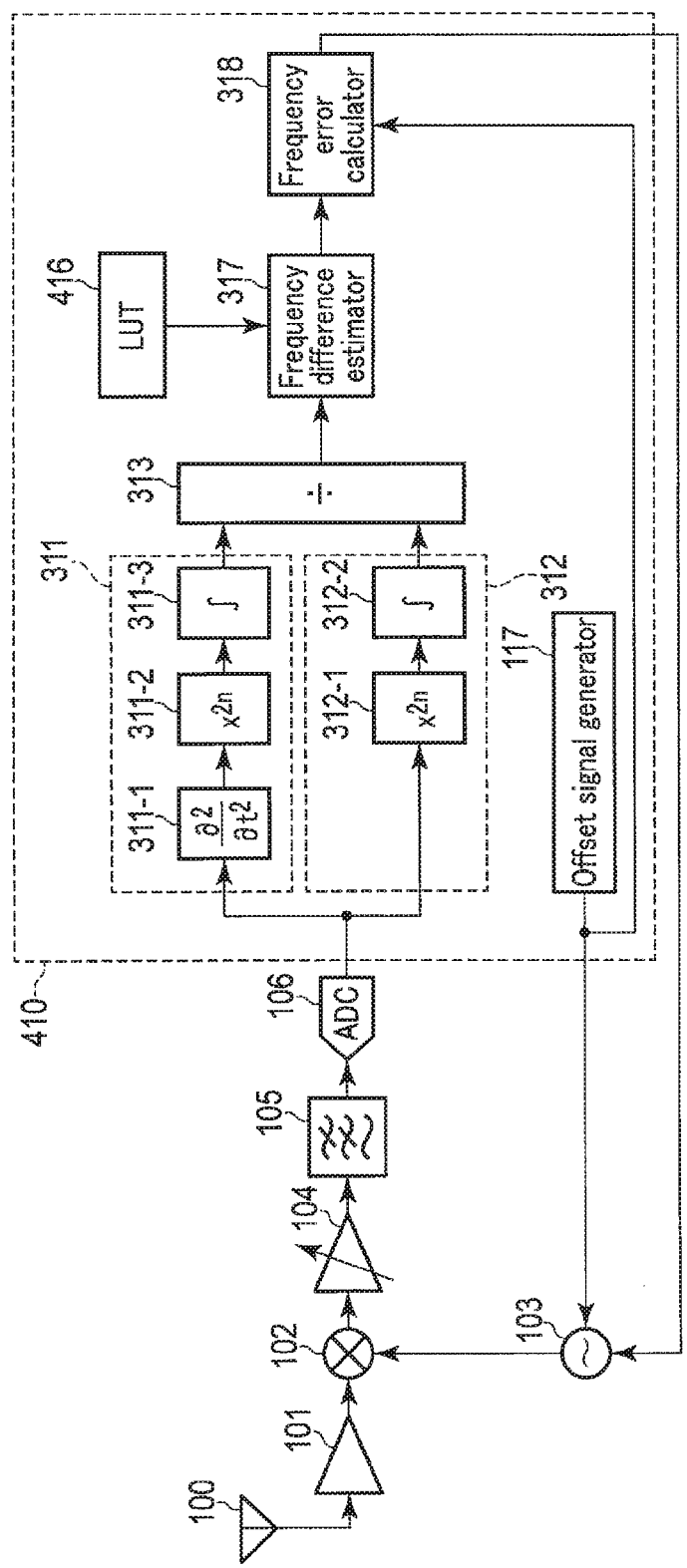
F I G. 12

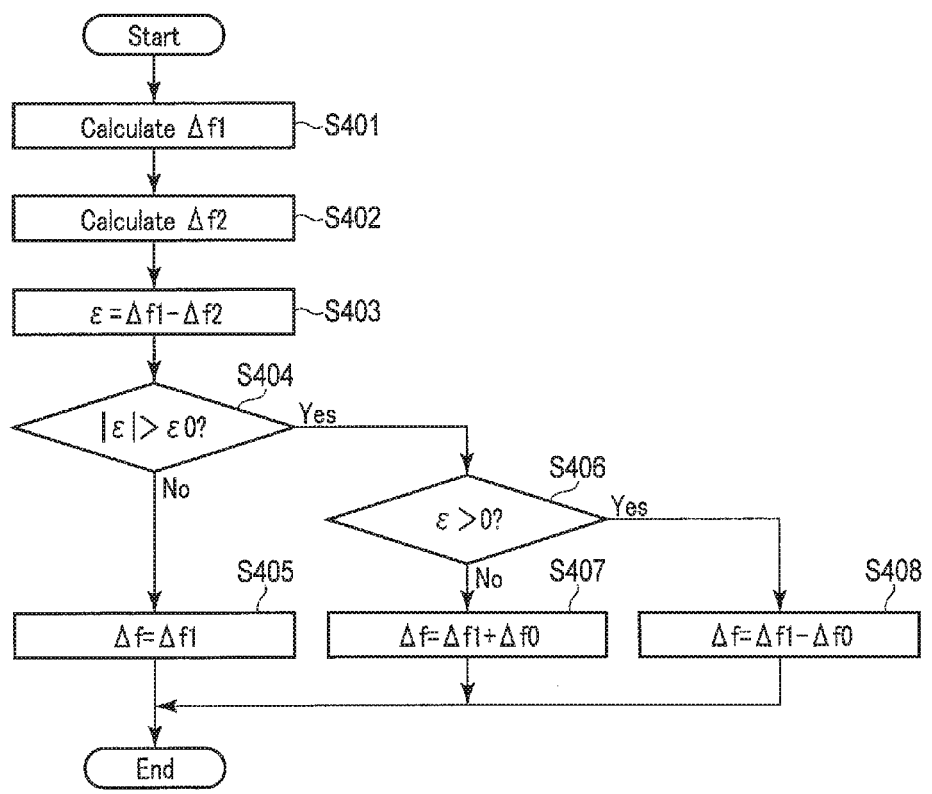
F I G. 13

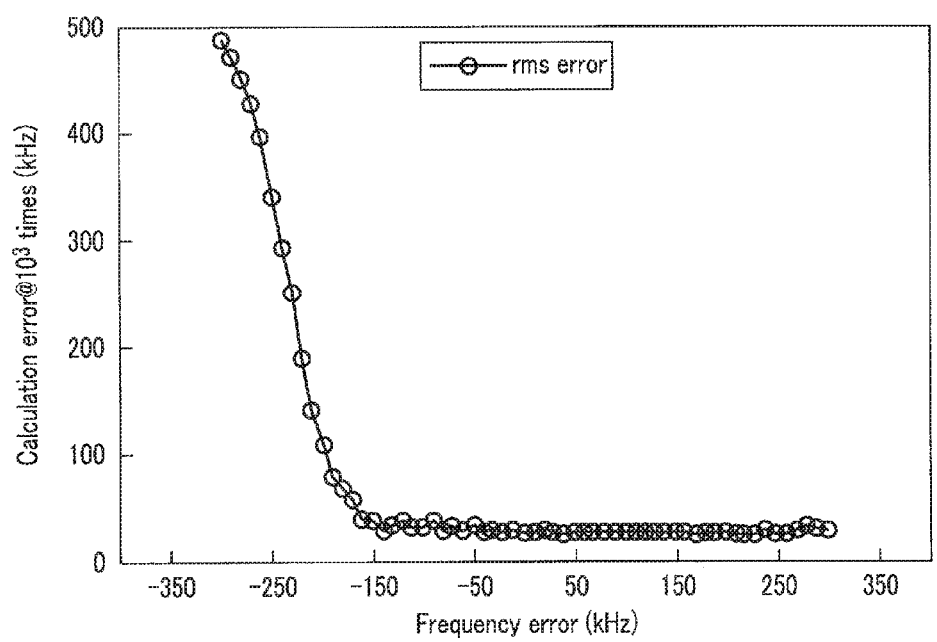
F I G. 14

AUTO FREQUENCY CONTROL CIRCUIT AND RECEIVER

CROSS-REFERENCE TO RELATED APPLICATIONS

This application is based upon and claims the benefit of priority from Japanese Patent Application No. 2014-256366, filed Dec. 18, 2014, the entire contents of which are incorporated herein by reference.

FIELD

Embodiments described herein relate generally to an AFC (Auto Frequency Control) technique.

BACKGROUND

Conventionally, there is known a receiver that generates an in-phase signal and a quadrature signal by quadrature-demodulating a reception signal, and calculates the phase of the reception signal based on the in-phase signal and the quadrature signal. The calculated phase is used not only to demodulate transmission data but also to control a frequency. More specifically, when a local frequency (that is, the oscillation frequency of a local oscillator) for down conversion is increased/decreased based on the phase, the local frequency can be made to follow a desired frequency (for example, a carrier frequency). According to this receiver, two analog baseband circuit systems configured to process the in-phase signal and the quadrature signal, respectively, are prepared. Hence, the receiver incurs a high design cost and requires a large circuit area as compared to a receiver including one analog baseband circuit system.

BRIEF DESCRIPTION OF THE DRAWINGS

FIG. 4 is a block diagram showing a receiver according to the second embodiment;

FIG. 6 is a graph showing the effect of the AFC circuit shown in FIG. 4;

FIG. 7 is a block diagram showing a receiver according to the third embodiment;

FIG. 8 is a flowchart showing the operation of an AFC circuit shown in FIG. 7 when generating an LUT (Look Up Table);

FIG. 11 is a graph showing the effect of the AFC circuit shown in FIG. 7;

FIG. 12 is a block diagram showing a receiver according to the fourth embodiment;

FIG. 13 is a flowchart showing the operations of two AFC circuits and a calculation error correction circuit included in a receiver according to the fifth embodiment; and FIG. 14 is a graph showing the effect of the two AFC circuits and the calculation error correction circuit included in the receiver according to the fifth embodiment.

DETAILED DESCRIPTION

Figure 1:
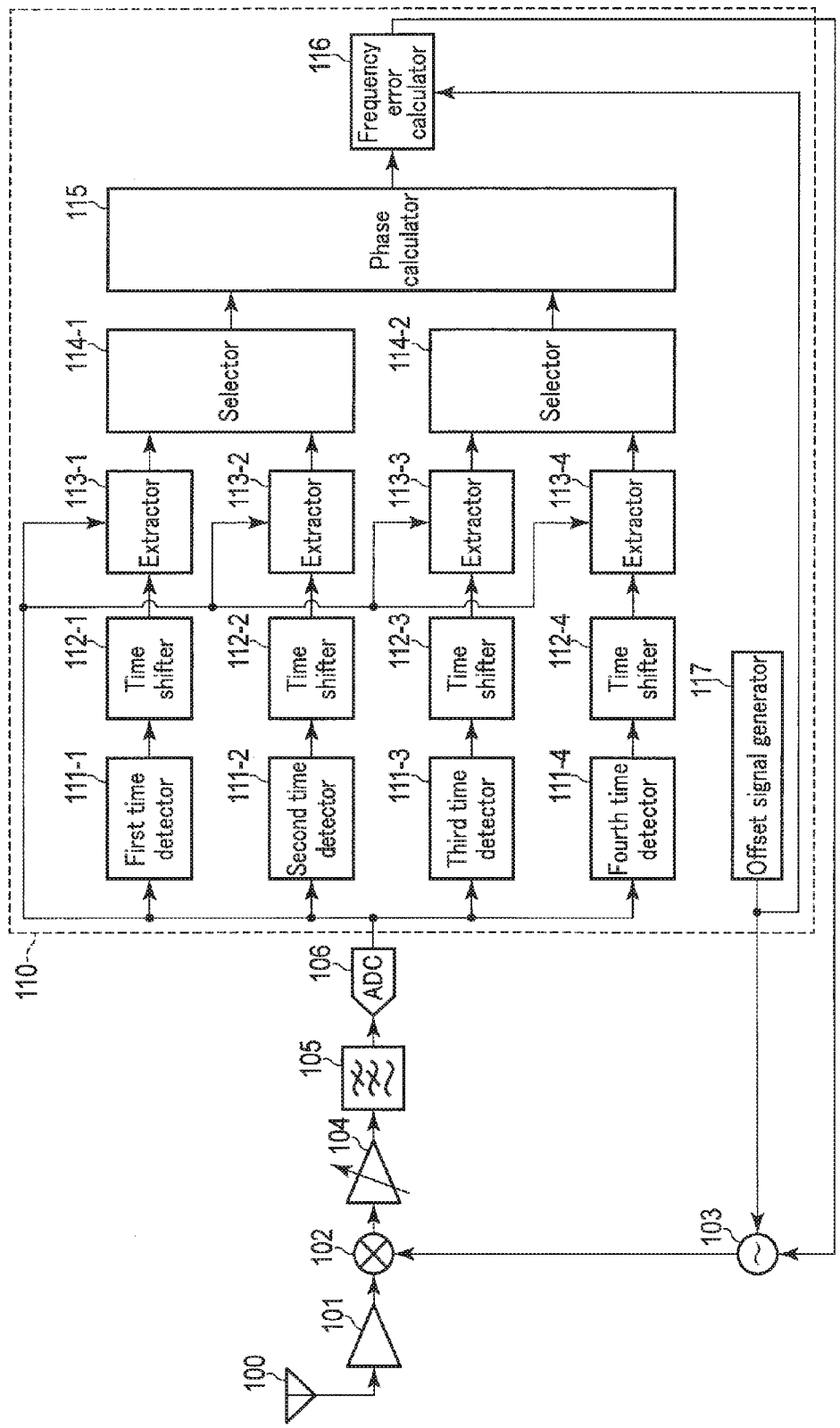
FIG. 1 is a block diagram showing a receiver according to the first embodiment.

The embodiments will now be described with reference to the accompanying drawings.

According to an embodiment, an auto frequency control circuit controls an oscillation frequency of a local oscillator that generates a local signal. The circuit includes an offset signal generator, a peak time detector, a first time shifter, a first extractor, a zero-crossing time detector, a second time shifter, a second extractor, a first phase calculator and a frequency error calculator. The offset signal generator generates an offset signal representing an offset frequency to be set in the local oscillator such that a phase of a digital signal corresponding to iteration of a known symbol having a predetermined period monotonously increases with respect to a time, and feeds back the offset signal to the local oscillator. The digital signal is generated by down-converting a constant envelope modulation signal using the local signal and analog-to-digital-converting the constant envelope modulation signal. The peak time detector detects, from the digital signal, a first time at which the digital signal exhibits one of a maximal value and a minimal value. The first time shifter adds or subtracts a first natural number multiple of the predetermined period to or from the first time to obtain a first extraction timing. The first extractor extracts a first sample corresponding to the first extraction timing from the digital signal. The zero-crossing time detector detects, from the digital signal, a second time at which the digital signal exhibits one of a positive zero-crossing and a negative zero-crossing. The second time shifter adds or subtracts the first natural number multiple of the predetermined period to or from the second time to obtain a second extraction timing. The second extractor extracts a second sample corresponding to the second extraction timing from the digital signal. The first phase calculator calculates a first phase change of the digital signal over the first natural number multiple of the predetermined period by performing an operation based on an inverse tangent function using the first sample and the second sample. The frequency error calculator calculates a frequency error of the digital signal using the first phase change and the offset frequency, and feeds back the frequency error to the local oscillator.

According to another embodiment, an auto frequency control circuit controls an oscillation frequency of a local oscillator that generates a local signal. The circuit includes an offset signal generator, a storage, an index parameter calculator, a frequency difference estimator and a frequency error calculator. The digital signal is generated by down-converting the constant envelope modulation signal using the local signal and analog-to-digital-converting the constant envelope modulation signal. The offset signal generator generates an offset signal representing an offset frequency to be set in the local oscillator such that a phase of a digital signal corresponding to iteration of a known symbol having a predetermined period monotonously increases with respect to a time, and feeds back the offset signal to the local oscillator. The storage stores an LUT (Look Up Table) in which a plurality of combinations of a frequency difference between a constant envelope modulation signal and the local signal and an index parameter corresponding to a value of one of a monotone increasing function and a monotone decreasing function to the frequency difference are registered. The index parameter calculator calculates a current index parameter based on the digital signal. The frequency difference estimator estimates a current frequency difference corresponding to the current index parameter by searching the LUT. The frequency error calculator calculates a frequency error of the digital signal using the current frequency difference and the offset frequency, and feeds back the frequency error to the local oscillator.

Note that the same or similar reference numerals denote elements that are the same as or similar to those already explained, and a repetitive description will basically be omitted.

First Embodiment

As shown in FIG. 1, a receiver according to the first embodiment includes an antenna 100, a low noise amplifier 101, a mixer 102, a local oscillator 103, an amplifier 104, a filter 105, an ADC (Analog-to-Digital Converter) 106, and an AFC circuit 110.

The antenna 100 receives a radio wave from a transmitter (not shown) via a space, thereby obtaining a reception RF signal. The antenna 100 outputs the reception RF signal to the low noise amplifier 101.

The low noise amplifier 101 receives the reception RF signal from the antenna 100. The low noise amplifier 101 amplifies (or attenuates) the amplitude of the reception RF signal, thereby obtaining an amplitude-adjusted RF signal. The low noise amplifier 101 outputs the amplitude-adjusted RF signal to the mixer 102.

The mixer 102 receives the amplitude-adjusted RF signal from the low noise amplifier 101, and receives a local signal from the local oscillator 103. The mixer 102 multiplies (that is, down-converts) the amplitude-adjusted RF signal by the local signal, thereby generating a product signal including a baseband signal component (or an intermediate frequency signal component) and an unnecessary high-frequency component. The mixer 102 outputs the product signal to the amplifier 104.

The local oscillator 103 receives an offset frequency signal and a frequency error signal (to be described later) from the AFC circuit 110. The local oscillator 103 oscillates at a frequency controlled by the offset frequency signal and the frequency error signal, thereby generating a local signal having this frequency. The local oscillator 103 outputs the local signal to the mixer 102. The local oscillator 103 can be implemented using, for example, a DCO (Digitally Controlled Oscillator).

The amplifier 104 receives the product signal from the mixer 102. The amplifier 104 amplifies (or attenuates) the product signal, thereby obtaining an amplitude-adjusted product signal. The amplifier 104 outputs the amplitude-adjusted product signal to the filter 105.

The filter 105 receives the amplitude-adjusted product signal from the amplifier 104. The filter 105 suppresses the unnecessary high-frequency component included in the amplitude-adjusted product signal, thereby obtaining an analog baseband signal (or analog intermediate frequency signal). The filter 105 outputs the analog baseband signal to the ADC 106.

Note that the low noise amplifier 101, the mixer 102, the local oscillator 103, the amplifier 104, and the filter 105 can also be called an RF front end circuit. That is, the RF front end circuit receives the reception RF signal from the antenna 100 and down-converts the reception RF signal, thereby generating an analog baseband signal. The RF front end circuit outputs the analog baseband signal to the ADC 106.

The ADC 106 receives the analog baseband signal from the filter 105. The ADC 106 analog-to-digital-converts the analog baseband signal, thereby obtaining a digital baseband signal (or digital intermediate frequency signal). The ADC 106 outputs the digital baseband signal to the AFC circuit 110.

The AFC circuit 110 receives the digital baseband signal from the ADC 106, and calculates the frequency error between the frequency (that is, the carrier frequency) of the reception RF signal and the frequency of the local signal (that is, the oscillation frequency of the local oscillator 103) based on the digital baseband signal. The AFC circuit 110 generates a frequency error signal that is a digital value representing the calculated frequency error, and feeds it back to the local oscillator 103. The local oscillator 103 changes the oscillation frequency so as to make the absolute value of the frequency error small. The frequency error comes closer to zero through this negative feedback control.

More specifically, the AFC circuit 110 calculates the frequency error based on the digital baseband signal corresponding to a known signal. The known signal is iteration (for example, a preamble signal) of a known symbol having a predetermined period. For example, in a case in which the receiver shown in FIG. 1 receives a constant envelope modulation signal such as a BPSK (Binary Phase Shift Keying) signal or a GMSK (Gaussian Minimum Shift Keying) signal, a digital baseband signal s(t) at time t can be given by $$s(t)=A\cos(2\pi(f+\Delta f)t+\phi(t)+\phi_0) \quad (1)$$

where A is the amplitude of the digital baseband signal, f is a predetermined offset frequency, $\Delta f$ is a frequency error, $\phi(t)$ is a phase component by modulation of transmission data, and $\phi_0$ is the initial phase difference between the reception RF signal and the local signal. Note that the DC level of the digital baseband signal s(t) is assumed to be 0. The offset frequency f corresponds to the set frequency of the digital baseband signal. Let T be the time length of the period of the known signal. According to the periodicity of the known signal, $$\phi(t)=\phi(t+nT) \quad (2)$$

holds, where n is an arbitrary integer. Hence, if the known signal is, for example, an 8-bit GMSK signal such as 10101010 or 01010101, and its bit rate is 1 Mbps, T=2 µs. Hence, $\phi(t)=\phi(t+2\times10^{-6})$ holds.

In addition, the AFC circuit 110 generates an oscillation frequency signal that is a digital value representing the offset frequency f, and feeds it back to the local oscillator 103. Note that to guarantee a monotone increase of the phase of the digital baseband signal throughout the time, the offset frequency f meets $$2\pi(f+\Delta f)>\phi'(t) \quad (3)$$

where $\phi'(t)$ is the derivative of $\phi(t)$.

The AFC circuit 110 includes a first time detector 111-1, a second time detector 111-2, a third time detector 111-3, a fourth time detector 111-4, time shifters 112-1, . . . , 112-4, extractors 113-1, . . . , 113-4, selectors 114-1 and 114-2, a phase calculator 115, a frequency error calculator 116, and an offset signal generator 117.

The first time detector 111-1 receives the digital baseband signal from the ADC 106. The first time detector 111-1 detects, from the digital baseband signal, a sample (that is, a time at which the phase of the digital baseband signal becomes $2\pi m$ (neighborhood)) representing the maximal value (neighborhood) of the digital baseband signal. The first time detector 111-1 can also be called a peak time detector. Here, m is an arbitrary integer. Note that the maximal value detected by the first time detector 111-1 is assumed to be larger than the DC level (for example, 0).

More specifically, the first time detector 111-1 searches for a time $t_0$ that meets $s(t_0)>0$ and $s'(t_0)=0$, where $s'(t)$ is the derivative of $s(t)$. The first time detector 111-1 outputs a detection signal representing the time $t_0$ (for example, a sample number) corresponding to the detected sample to the time shifter 112-1. Concerning the time $t_0$, $$2\pi(f+\Delta f)t_0+\phi(t_0)+\phi_0=2\pi m \quad (4)$$

holds.

Note that due to the influence of noise, the first time detector 111-1 may detect a plurality of candidate times (that is, a plurality of maximal values) for the time $t_0$. In this case, the first time detector 111-1 may calculate the average value of the plurality of detected candidate times as the time $t_0$, or may calculate one of the plurality of candidate times, which gives the maximum value to $s(t)$, as the time $t_0$.

The time shifter 112-1 receives the detection signal from the first time detector 111-1, and performs an operation of shifting the time $t_0$ represented by the detection signal using the time length T. More specifically, the time shifter 112-1 adds or subtracts T to or from the time $t_0$ represented by the detection signal. For example, if the sample of time $t_0+T$ does not exist, the time shifter 112-1 subtracts T from the time $t_0$. On the other hand, if the sample of time $t_0-T$ does not exist, the time shifter 112-1 adds T to the time $t_0$. Note that if both the sample of time $t_0+T$ and the sample of time $t_0-T$ exist, the time shifter 112-1 can either add or subtract T to or from the time $t_0$ represented by the detection signal. When T is added to the time $t_0$ represented by the detection signal, the extractor 113-1 (to be described later) starts extraction after the sample of time $t_0+T$ appears. The time shifter 112-1 outputs an extraction timing signal representing a time (extraction timing) as the operation result to the extractor 113-1.

The extractor 113-1 receives the digital baseband signal from the ADC 106, and receives the extraction timing signal from the time shifter 112-1. The extractor 113-1 extracts a sample corresponding to the extraction timing represented by the extraction timing signal from the digital baseband signal. The extractor 113-1 outputs the extracted sample to the selector 114-1.

That is, the extractor 113-1 extracts a sample $s(t_0\pm T)$. Concerning this sample, $$s(t_0\pm T)=A\cos(2\pi(f+\Delta f)(t_0\pm T)+\phi(t_0\pm T)+\phi_0)=A\cos(2\pi(f+\Delta f)t_0+\phi(t_0)+\phi_0\pm 2\pi(f+\Delta f)T)=A\cos(2\pi m\pm 2\pi(f+\Delta f)T)=A\cos(2\pi(f+\Delta f)T) \quad (5)$$

can be derived using equations (2) and (4).

Figure 2:
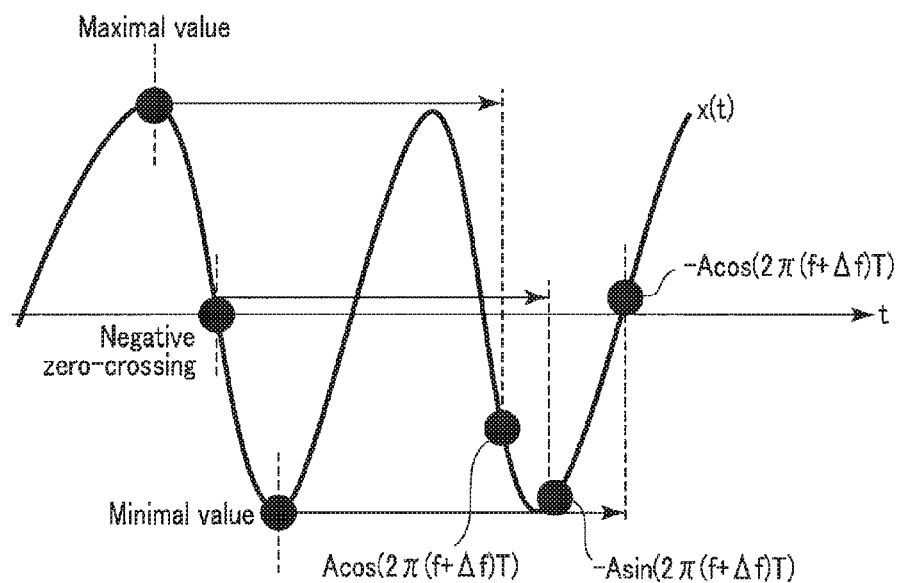
FIG. 2 is an explanatory view of the operation of an AFC circuit shown in FIG. 1.

Hence, for example, the sample $s(t_0+T)$ equals $A\cos(2\pi(f+\Delta f)T)$, as shown in FIG. 2. Note that according to equation (2), if the time shift width of the time shifter 112-1 is $\pm nT$, $A\cos(2\pi(f+\Delta f)nT)$ can be extracted.

The second time detector 111-2 receives the digital baseband signal from the ADC 106. The second time detector 111-2 detects, from the digital baseband signal, a sample (that is, a time at which the phase of the digital baseband signal becomes $\pi+2\pi m$ (neighborhood)) representing the minimal value (neighborhood) of the digital baseband signal. The second time detector 111-2 can also be called a peak time detector. The minimal value detected by the second time detector 111-2 is assumed to be smaller than the DC level (for example, 0).

More specifically, the second time detector 111-2 searches for a time $t_1$ that meets $s(t_1)<0$ and $s'(t_1)=0$. The second time detector 111-2 outputs a detection signal representing the time $t_1$ corresponding to the detected sample to the time shifter 112-2. Concerning the time $t_1$, $$2\pi(f+\Delta f)t_1+\phi(t_1)+\phi_0=\pi+2\pi m \quad (6)$$

holds.

Note that due to the influence of noise, the second time detector 111-2 may detect a plurality of candidate times (that is, a plurality of minimal values) for the time $t_1$. In this case, the second time detector 111-2 may calculate the average value of the plurality of detected candidate times as the time $t_1$, or may calculate one of the plurality of candidate times, which gives the minimum value to $s(t)$, as the time $t_1$.

The time shifter 112-2 receives the detection signal from the second time detector 111-2, and performs an operation of shifting the time $t_1$ represented by the detection signal using the time length T. More specifically, the time shifter 112-2 adds or subtracts T to or from the time $t_1$ represented by the detection signal. For example, if the sample of time $t_1+T$ does not exist, the time shifter 112-2 subtracts T from the time $t_1$. On the other hand, if the sample of time $t_1-T$ does not exist, the time shifter 112-2 adds T to the time $t_1$. Note that if both the sample of time $t_1+T$ and the sample of time $t_1-T$ exist, the time shifter 112-2 can either add or subtract T to or from the time $t_1$ represented by the detection signal. When T is added to the time $t_1$ represented by the detection signal, the extractor 113-2 (to be described later) starts extraction after the sample of time $t_1+T$ appears. The time shifter 112-2 outputs an extraction timing signal representing a time (extraction timing) as the operation result to the extractor 113-2.

The extractor 113-2 receives the digital baseband signal from the ADC 106, and receives the extraction timing signal from the time shifter 112-2. The extractor 113-2 extracts a sample corresponding to the extraction timing represented by the extraction timing signal from the digital baseband signal. The extractor 113-2 outputs the extracted sample to the selector 114-1.

That is, the extractor 113-2 extracts a sample $s(t_1\pm T)$. Concerning this sample, $$s(t_1\pm T)=A\cos(2\pi(f+\Delta f)(t_1\pm T)+\phi(t_1\pm T)+\phi_0)=A\cos(2\pi(f+\Delta f)t_1+\phi(t_1)+\phi_0\pm 2\pi(f+\Delta f)T)=A\cos(\pi+2\pi m\pm 2\pi(f+\Delta f)T)=-A\cos(2\pi(f+\Delta f)T) \quad (7)$$

can be derived using equations (2) and (6).

Hence, for example, the sample $s(t_1+T)$ equals $-A\cos(2\pi(f+\Delta f)T)$, as shown in FIG. 2. Note that according to equation (2), if the time shift width of the time shifter 112-2 is $\pm nT$, $-A\cos(2\pi(f+\Delta f)nT)$ can be extracted.

The third time detector 111-3 receives the digital baseband signal from the ADC 106. The third time detector 111-3 detects, from the digital baseband signal, a sample (that is, a time at which the phase of the digital baseband signal becomes $-\pi/2+2\pi m$ (neighborhood)) representing the positive zero-crossing (neighborhood) of the digital baseband signal. The third time detector 111-3 can also be called a zero-crossing time detector.

More specifically, the third time detector 111-3 searches for a time $t_2$ that meets $s(t_2)<0$ and $s(t_2+1)\leq 0$. The third time detector 111-3 outputs a detection signal representing the time $t_2$ corresponding to the detected sample to the time shifter 112-3. Concerning the time $t_2$, $$2\pi(f+\Delta f)t_2+\phi(t_2)+\phi_0=\frac{\pi}{2}+2\pi m \quad (8)$$

holds.

Note that theoretically, the positive zero-crossing appears only once during the time from the appearance of the minimal value to the appearance of the immediately succeeding maximal value. However, due to the influence of noise, the third time detector 111-3 may detect a plurality of candidate times (that is, a plurality of positive zero-crossings) for the time $t_2$. In this case, the third time detector 111-3 may calculate the average value or median of the plurality of detected candidate times as the time $t_2$, or may select one of the plurality of candidate times as the time $t_2$. In addition, a negative zero-crossing that meets s'(t)<0 (that is, s(t)>0 and s(t+1)≤0) exists between adjacent positive zero-crossings. In this case, the third time detector 111-3 may add the time t to the plurality of candidate times on condition that the time t representing the negative zero-crossing meets $t_1$<t<$t_0$.

The time shifter 112-3 receives the detection signal from the third time detector 111-3, and performs an operation of shifting the time $t_2$ represented by the detection signal using the time length T. More specifically, the time shifter 112-3 adds or subtracts T to or from the time $t_2$ represented by the detection signal. For example, if the sample of time $t_2$+T does not exist, the time shifter 112-3 subtracts T from the time $t_2$. On the other hand, if the sample of time $t_2$−T does not exist, the time shifter 112-3 adds T to the time $t_2$. Note that if both the sample of time $t_2$+T and the sample of time $t_2$−T exist, the time shifter 112-3 can either add or subtract T to or from the time $t_2$ represented by the detection signal. When T is added to the time $t_2$ represented by the detection signal, the extractor 113-3 (to be described later) starts extraction after the sample of time $t_2$+T appears. The time shifter 112-3 outputs an extraction timing signal representing a time (extraction timing) as the operation result to the extractor 113-3.

The extractor 113-3 receives the digital baseband signal from the ADC 106, and receives the extraction timing signal from the time shifter 112-3. The extractor 113-3 extracts a sample corresponding to the extraction timing represented by the extraction timing signal from the digital baseband signal. The extractor 113-3 outputs the extracted sample to the selector 114-2.

That is, the extractor 113-3 extracts a sample $s(t_2 \pm T)$. Concerning this sample, $$\begin{aligned} s(t_2 \pm T) &= A\cos(2\pi(f + \Delta f)(t_2 \pm T) + \phi(t_2 \pm T) + \phi_0) \quad (9) \\ &= A\cos(2\pi(f + \Delta f)t_2 + \phi(t_2) + \phi_0 \pm 2\pi(f + \Delta f)T) \\ &= A\cos\left(-\frac{\pi}{2} + 2\pi m \pm 2\pi(f + \Delta f)T\right) \\ &= \pm A\sin(2\pi(f + \Delta f)T) \end{aligned}$$

can be derived using equations (2) and (8).

Note that according to equation (2), if the time shift width of the time shifter 112-3 is ±nT, ±A sin(2π(f+Δf)nT) can be extracted.

The fourth time detector 111-4 receives the digital baseband signal from the ADC 106. The fourth time detector 111-4 detects, from the digital baseband signal, a sample (that is, a time at which the phase of the digital baseband signal becomes π/2+2πm (neighborhood)) representing the negative zero-crossing (neighborhood) of the digital baseband signal. The fourth time detector 111-4 can also be called a zero-crossing time detector.

More specifically, the fourth time detector 111-4 searches for a time $t_3$ that meets $s(t_3)$>0 and $s(t_3+1)$≤0. The fourth time detector 111-4 outputs a detection signal representing the time $t_3$ corresponding to the detected sample to the time shifter 112-4. Concerning the time $t_3$, $$2\pi(f + \Delta f)t_3 + \phi(t_3) + \phi_0 = \frac{\pi}{2} + 2\pi m \quad (10)$$

holds.

Note that theoretically, the negative zero-crossing appears only once during the time from the appearance of the maximal value to the appearance of the immediately succeeding minimal value. However, due to the influence of noise, the fourth time detector 111-4 may detect a plurality of candidate times (that is, a plurality of negative zero-crossings) for the time $t_3$. In this case, the fourth time detector 111-4 may calculate the average value or median of the plurality of detected candidate times as the time $t_3$, or may select one of the plurality of candidate times as the time $t_3$. In addition, a positive zero-crossing that meets s'(t)>0 (that is, s(t)<0 and s(t+1)≥0) exists between adjacent negative zero-crossings. In this case, the fourth time detector 111-4 may add the time t to the plurality of candidate times on condition that the time t representing the positive zero-crossing meets $t_0$<t<$t_1$.

The time shifter 112-4 receives the detection signal from the fourth time detector 111-4, and performs an operation of shifting the time $t_3$ represented by the detection signal using the time length T. More specifically, the time shifter 112-4 adds or subtracts T to or from the time $t_3$ represented by the detection signal. For example, if the sample of time $t_3$+T does not exist, the time shifter 112-4 subtracts T from the time $t_3$. On the other hand, if the sample of time $t_3$−T does not exist, the time shifter 112-4 adds T to the time $t_3$. Note that if both the sample of time $t_3$+T and the sample of time $t_3$−T exist, the time shifter 112-4 can either add or subtract T to or from the time $t_3$ represented by the detection signal. When T is added to the time $t_3$ represented by the detection signal, the extractor 113-4 (to be described later) starts extraction after the sample of time $t_3$+T appears. The time shifter 112-4 outputs an extraction timing signal representing a time (extraction timing) as the operation result to the extractor 113-4.

The extractor 113-4 receives the digital baseband signal from the ADC 106, and receives the extraction timing signal from the time shifter 112-4. The extractor 113-4 extracts a sample corresponding to the extraction timing represented by the extraction timing signal from the digital baseband signal. The extractor 113-4 outputs the extracted sample to the selector 114-2.

That is, the extractor 113-4 extracts a sample $s(t_3 \pm T)$. Concerning this sample, $$\begin{aligned} s(t_3 \pm T) &= A\cos(2\pi(f + \Delta f)(t_3 \pm T) + \phi(t_3 \pm T) + \phi_0) \quad (11) \\ &= A\cos(2\pi(f + \Delta f)t_3 + \phi(t_3) + \phi_0 \pm 2\pi(f + \Delta f)T) \\ &= A\cos\left(\frac{\pi}{2} + 2\pi m \pm 2\pi(f + \Delta f)T\right) \\ &= \mp A\sin(2\pi(f + \Delta f)T) \end{aligned}$$

can be derived using equations (2) and (10).

Hence, for example, the sample $s(t_3+T)$ equals −A sin(2π(f+Δf)T), as shown in FIG. 2. Note that according to equation (2), if the time shift width of the time shifter 112-4 is ±nT, −(±A sin(2π(f+Δf)nT)) can be extracted.

The selector 114-1 receives the samples from the extractors 113-1 and 113-2. The selector 114-1 selects one of the samples, and outputs the selected sample (to be referred to as a first sample hereinafter) to the phase calculator 115. According to equations (5) and (7), the first sample represents A cos(2π(f+Δf)T) or a sign-inverted value thereof. Note that upon receiving a sample from the extractor 113-1 or 113-2 for the first time, the selector 114-1 may automatically select the sample. Alternatively, the selector 114-1 may be replaced with an average calculator that receives a plurality of samples from the extractors 113-1 and 113-2, and calculates the average value of A cos(2π(f+Δf)T) (or the average value of −A cos(2π(f+Δf)T)). A reliable calculation result can be obtained by averaging the plurality of samples.

The selector 114-2 receives the samples from the extractors 113-3 and 113-4. The selector 114-2 selects one of the samples, and outputs the selected sample (to be referred to as a second sample hereinafter) to the phase calculator 115. According to equations (9) and (11), the second sample represents A sin(2π(f+Δf)T) or a sign-inverted value thereof. Note that upon receiving a sample from the extractor 113-3 or 113-4 for the first time, the selector 114-2 may automatically select the sample. Alternatively, the selector 114-2 may be replaced with an average calculator that receives a plurality of samples from the extractors 113-3 and 113-4, and calculates the average value of A sin(2π(f+Δf)T) (or the average value of −A sin(2π(f+Δf)T)). A reliable calculation result can be obtained by averaging the plurality of samples.

The phase calculator 115 receives the first sample from the selector 114-1, and receives the second sample from the selector 114-2. Using the first sample and the second sample, the phase calculator 115 calculates a phase change in the digital baseband signal throughout one period of the predetermined period. The phase calculator 115 outputs a phase signal representing the calculated phase change to the frequency error calculator 116. More specifically, the phase calculator 115 may calculate a phase change Δp by performing an operation based on an inverse tangent function given by $$\Delta p = \arctan\left(\frac{A\sin(2\pi(f + \Delta f)T)}{A\cos(2\pi(f + \Delta f)T)}\right) + 2\pi m \quad (12)$$

The general range of the inverse tangent function is (−π/2, π/2). However, the true value of the phase change Δp may deviate from the range (−π/2, π/2). The phase change Δp shifts by 2π depending on the value of the integer m. For this reason, if a wrong value is set to the integer m, a large calculation error (to be referred to as a 2π cycle error hereinafter) occurs. Hence, to correctly calculate the phase change Δp, an appropriate value needs to be set to the integer m included in equation (12). Normally, the set value of the integer m is determined such that, for example, the frequency error Δf falls within a range defined by a standard that the receiver shown in FIG. 1 complies with. However, a wrong value may be set to the integer m due to the influence of noise.

The frequency error calculator 116 receives the phase signal from the phase calculator 115, and receives an offset signal from the offset signal generator 117. The frequency error calculator 116 calculates the frequency error Δf using the phase change Δp represented by the phase signal and the offset frequency f represented by the offset signal in accordance with $$2\pi(f + \Delta f)T = \Delta p \quad (13)$$

$$2\pi\Delta fT = \Delta p - 2\pi fT$$

$$\Delta f = \frac{\Delta p}{2\pi T} - f$$

The frequency error calculator 116 feeds back a frequency error signal representing the calculated frequency error Δf to the local oscillator 103.

The offset signal generator 117 generates an offset signal representing the predetermined offset frequency f, and outputs it to the local oscillator 103 and the frequency error calculator 116. Note that the offset frequency f meets inequality (3) throughout the time, as described above.

Figure 3:
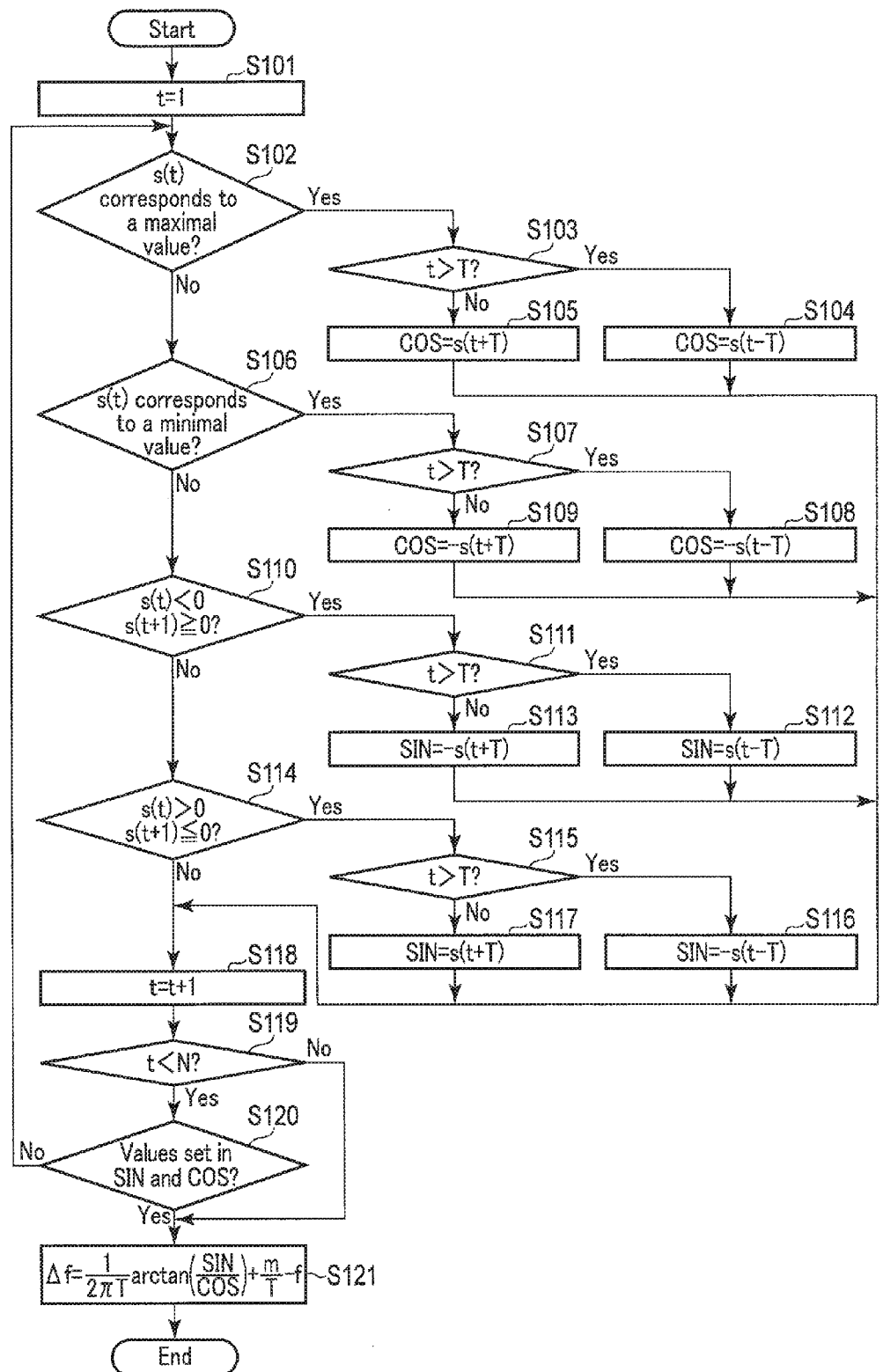
FIG. 3 is a flowchart showing the operation of the AFC circuit shown in FIG. 1.

The AFC circuit 110 operates as shown in FIG. 3. First, the AFC circuit 110 initializes a variable t representing the number of symbols to 1 (step S101). Next, the process advances to step S102. Note that steps S102, S106, S110, and S114 may be executed in an order different from that shown in FIG. 3 or may be executed in parallel.

In step S102, the first time detector 111-1 determines whether the digital baseband signal s(t) exhibits the maximal value. Upon determining that the digital baseband signal s(t) exhibits the maximal value, the process advances to step S103. Otherwise, the process advances to step S106.

In step S103, the time shifter 112-1 determines whether t is larger than T. If t is larger than T, s(t−T) exists. Hence, the time shifter 112-1 subtracts T from t, and the process advances to step S104. If t is equal to or smaller than T, s(t−T) does not exist. Hence, the time shifter 112-1 adds T to t, and the process advances to step S105.

In step S104, the extractor 113-1 extracts the sample s(t−T) and substitutes it into a variable COS, and the process advances to step S118. The variable COS is a variable used to hold a candidate value of A cos(2π(f+Δf)T). In step S105, the extractor 113-1 extracts the sample s(t+T) and substitutes it into the variable COS, and the process advances to step S118.

In step S106, the second time detector 111-2 determines whether the digital baseband signal s(t) exhibits the minimal value. Upon determining that the digital baseband signal s(t) exhibits the minimal value, the process advances to step S107. Otherwise, the process advances to step S110.

In step S107, the time shifter 112-2 determines whether t is larger than T. If t is larger than T, s(t−T) exists. Hence, the time shifter 112-2 subtracts T from t, and the process advances to step S108. If t is equal to or smaller than T, s(t−T) does not exist. Hence, the time shifter 112-2 adds T to t, and the process advances to step S109.

In step S108, the extractor 113-2 extracts the sample s(t−T), inverts the sign, and substitutes it into the variable COS, and the process advances to step S118. In step S109, the extractor 113-2 extracts the sample s(t+T), inverts the sign, and substitutes it into the variable COS, and the process advances to step S118.

In step S110, the third time detector 111-3 determines whether the digital baseband signal s(t) exhibits the positive zero-crossing. Upon determining that the digital baseband signal s(t) exhibits the positive zero-crossing, the process advances to step S111. Otherwise, the process advances to step S114.

In step S111, the time shifter 112-3 determines whether t is larger than T. If t is larger than T, s(t−T) exists. Hence, the time shifter 112-3 subtracts T from t, and the process advances to step S112. If t is equal to or smaller than T, s(t−T) does not exist. Hence, the time shifter 112-3 adds T to t, and the process advances to step S113.

In step S112, the extractor 113-3 extracts the sample s(t−T), and substitutes it into a variable SIN, and the process advances to step S118. The variable SIN is a variable used to hold a candidate value of A sin(2π(f+Δf)T). In step S113, the extractor 113-3 extracts the sample s(t+T), inverts the sign, and substitutes it into the variable SIN, and the process advances to step S118.

In step S114, the fourth time detector 111-4 determines whether the digital baseband signal s(t) exhibits the negative zero-crossing. Upon determining that the digital baseband signal s(t) exhibits the negative zero-crossing, the process advances to step S115. Otherwise, the process advances to step S118.

In step S115, the time shifter 112-4 determines whether t is larger than T. If t is larger than T, s(t−T) exists. Hence, the time shifter 112-4 subtracts T from t, and the process advances to step S116. If t is equal to or smaller than T, s(t−T) does not exist. Hence, the time shifter 112-4 adds T to t, and the process advances to step S117.

In step S116, the extractor 113-4 extracts the sample s(t−T), inverts the sign, and substitutes it into the variable SIN, and the process advances to step S118. In step S117, the extractor 113-4 extracts the sample s(t+T), and substitutes it into the variable SIN, and the process advances to step S118.

In step S118, the AFC circuit 110 increments t by 1. Next, the AFC circuit 110 determines whether t is smaller than N (step S119). N is the number of samples usable for calculation of the frequency error Δf. If t is smaller than N, the process advances to step S120. Otherwise, the process advances to step S121.

In step S120, the AFC circuit 110 determines whether values are set in the variable SIN and the variable COS. If values are set in the variable SIN and the variable COS, the process advances to step S121. Otherwise, the process returns to step S102.

In step S121, the phase calculator 115 and the frequency error calculator 116 calculate the frequency error Δf in accordance with equations (12) and (13). After step S121, the processing shown in FIG. 3 ends.

As described above, the receiver according to the first embodiment generates a digital baseband signal using one analog baseband circuit system, calculates the phase of the digital baseband signal in the digital domain, and calculates the frequency error of the local frequency based on the phase. Hence, according to the receiver, it is possible to make the local frequency follow a desired frequency without using two analog baseband circuit systems.

Note that when the signal length used to calculate the frequency error is sufficiently long, A cos(2π(f+Δf)T) can be extracted even if the set of the first time detector 111-1, the time shifter 112-1, and the extractor 113-1, or the set of the second time detector 111-2, the time shifter 112-2, and the extractor 113-2 is removed. Similarly, when the signal length used to calculate the frequency error is sufficiently long, A sin(2π(f+Δf)T) can be extracted even if the set of the third time detector 111-3, the time shifter 112-3, and the extractor 113-3, or the set of the fourth time detector 111-4, the time shifter 112-4, and the extractor 113-4 is removed.

Second Embodiment

As shown in FIG. 4, a receiver according to the second embodiment includes an antenna 100, a low noise amplifier 101, a mixer 102, a local oscillator 103, an amplifier 104, a filter 105, an ADC 106, and an AFC circuit 210.

The ADC 106 shown in FIG. 4 is different from the ADC 106 shown in FIG. 1 in that a digital baseband signal is output to the AFC circuit 210. The local oscillator 103 shown in FIG. 4 is different from the local oscillator 103 shown in FIG. 1 in that an offset frequency signal and a frequency error signal are received from the AFC circuit 210.

The AFC circuit 210 is different from the AFC circuit 110 shown in FIG. 1 in the frequency error calculation technique. The AFC circuit 210 includes a first time detector 111-1, a second time detector 111-2, a third time detector 111-3, a fourth time detector 111-4, time shifters 212-1-1, ..., 212-1-M, 212-2-1, ..., 212-2-M, 212-3-1, ..., 212-3-M, 212-4-1, ..., 212-4-M, extractors 213-1-1, ..., 213-1-M, 213-2-1, ..., 213-2-M, 213-3-1, ..., 213-3-M, 213-4-1, ..., 213-4-M, average calculators 214-1-1, ..., 214-1-M, 214-2-1, ..., 214-2-M, phase calculators 215-1, ..., 215-M, a frequency error calculator 216, and an offset signal generator 117. Here, M is an arbitrary integer (M≥2).

The first time detector 111-1 shown in FIG. 4 is different from the first time detector 111-1 shown in FIG. 1 in that a detection signal is output to the time shifters 212-1-1, ..., 212-1-M. The second time detector 111-2 shown in FIG. 4 is different from the second time detector 111-2 shown in FIG. 1 in that a detection signal is output to the time shifters 212-2-1, ..., 212-2-M. The third time detector 111-3 shown in FIG. 4 is different from the third time detector 111-3 shown in FIG. 1 in that a detection signal is output to the time shifters 212-3-1, ..., 212-3-M. The fourth time detector 111-4 shown in FIG. 4 is different from the fourth time detector 111-4 shown in FIG. 1 in that a detection signal is output to the time shifters 212-4-1, ..., 212-4-M. The offset signal generator 117 shown in FIG. 4 is different from the offset signal generator 117 shown in FIG. 1 in that an offset signal is output to the frequency error calculator 216.

In the following explanation, the functional units will be generalized using, as a suffix, an integer n that meets 1≤n≤M.

A time shifter 212-1-$n$ receives the detection signal from the first time detector 111-1, and performs an operation of shifting a time $t_0$ represented by the detection signal using a time length T. More specifically, the time shifter 212-1-$n$ adds or subtracts nT to or from the time $t_0$ represented by the detection signal. For example, if the sample of time $t_0+nT$ does not exist, the time shifter 212-1-$n$ subtracts nT from the time $t_0$. On the other hand, if the sample of time $t_0-nT$ does not exist, the time shifter 212-1-$n$ adds nT to the time $t_0$. Note that if both the sample of time $t_0+nT$ and the sample of time $t_0-nT$ exist, the time shifter 212-1-$n$ can either add or subtract nT to or from the time $t_0$ represented by the detection signal. When nT is added to the time $t_0$ represented by the detection signal, an extractor 213-1-$n$ (to be described later) starts extraction after the sample of time $t_0+nT$ appears. The time shifter 212-1-$n$ outputs an extraction timing signal representing a time (extraction timing) as the operation result to the extractor 213-1-$n$.

The extractor 213-1-$n$ receives the digital baseband signal from the ADC 106, and receives the extraction timing signal from the time shifter 212-1-$n$. The extractor 213-1-$n$ extracts a sample corresponding to the extraction timing represented by the extraction timing signal from the digital baseband signal. The extractor 213-1-$n$ outputs the extracted sample to an average calculator 214-1-$n$.

That is, the extractor 213-1-$n$ extracts a sample s(to ±nT). Concerning this sample, an equation obtained by replacing T included in equation (5) with nT holds.

A time shifter 212-2-$n$ receives the detection signal from the second time detector 111-2, and performs an operation of shifting a time $t_1$ represented by the detection signal using the time length T. More specifically, the time shifter 212-2-$n$ adds or subtracts nT to or from the time $t_1$ represented by the detection signal. For example, if the sample of time $t_1+nT$ does not exist, the time shifter 212-2-*n* subtracts nT from the time $t_1$. On the other hand, if the sample of time $t_1$−nT does not exist, the time shifter 212-2-*n* adds nT to the time $t_1$. Note that if both the sample of time $t_1$+nT and the sample of time $t_1$−nT exist, the time shifter 212-2-*n* can either add or subtract nT to or from the time $t_1$ represented by the detection signal. When nT is added to the time $t_1$ represented by the detection signal, an extractor 213-2-*n* (to be described later) starts extraction after the sample of time $t_1$+nT appears. The time shifter 212-2-*n* outputs an extraction timing signal representing a time (extraction timing) as the operation result to the extractor 213-2-*n*.

The extractor 213-2-*n* receives the digital baseband signal from the ADC 106, and receives the extraction timing signal from the time shifter 212-2-*n*. The extractor 213-2-*n* extracts a sample corresponding to the extraction timing represented by the extraction timing signal from the digital baseband signal. The extractor 213-2-*n* outputs the extracted sample to the average calculator 214-1-*n*.

That is, the extractor 213-2-*n* extracts a sample $s(t_1 \pm nT)$. Concerning this sample, an equation obtained by replacing T included in equation (7) with nT holds.

A time shifter 212-3-*n* receives the detection signal from the third time detector 111-3, and performs an operation of shifting a time $t_2$ represented by the detection signal using the time length T. More specifically, the time shifter 212-3-*n* adds or subtracts nT to or from the time $t_2$ represented by the detection signal. For example, if the sample of time $t_2$+nT does not exist, the time shifter 212-3-*n* subtracts nT from the time $t_2$. On the other hand, if the sample of time $t_2$−nT does not exist, the time shifter 212-3-*n* adds nT to the time $t_2$. Note that if both the sample of time $t_2$+nT and the sample of time $t_2$−nT exist, the time shifter 212-3-*n* can either add or subtract nT to or from the time $t_2$ represented by the detection signal. When nT is added to the time $t_2$ represented by the detection signal, an extractor 213-3-*n* (to be described later) starts extraction after the sample of time $t_2$+nT appears. The time shifter 212-3-*n* outputs an extraction timing signal representing a time (extraction timing) as the operation result to the extractor 213-3-*n*.

The extractor 213-3-*n* receives the digital baseband signal from the ADC 106, and receives the extraction timing signal from the time shifter 212-3-*n*. The extractor 213-3-*n* extracts a sample corresponding to the extraction timing represented by the extraction timing signal from the digital baseband signal. The extractor 213-3-*n* outputs the extracted sample to an average calculator 214-2-*n*.

That is, the extractor 213-3-*n* extracts a sample $s(t_2 \pm nT)$. Concerning this sample, an equation obtained by replacing T included in equation (9) with nT holds.

A time shifter 212-4-*n* receives the detection signal from the fourth time detector 111-4, and performs an operation of shifting a time $t_3$ represented by the detection signal using the time length T. More specifically, the time shifter 212-4-*n* adds or subtracts nT to or from the time $t_3$ represented by the detection signal. For example, if the sample of time $t_3$+nT does not exist, the time shifter 212-4-*n* subtracts nT from the time $t_3$. On the other hand, if the sample of time $t_3$−nT does not exist, the time shifter 212-4-*n* adds nT to the time $t_3$. Note that if both the sample of time $t_3$+nT and the sample of time $t_3$−nT exist, the time shifter 212-4-*n* can either add or subtract nT to or from the time $t_3$ represented by the detection signal. When nT is added to the time $t_3$ represented by the detection signal, an extractor 213-4-*n* (to be described later) starts extraction after the sample of time $t_3$+nT appears. The time shifter 212-4-*n* outputs an extraction timing signal representing a time (extraction timing) as the operation result to the extractor 213-4-*n*.

The extractor 213-4-*n* receives the digital baseband signal from the ADC 106, and receives the extraction timing signal from the time shifter 212-4-*n*. The extractor 213-4-*n* extracts a sample corresponding to the extraction timing represented by the extraction timing signal from the digital baseband signal. The extractor 213-4-*n* outputs the extracted sample to the average calculator 214-2-*n*.

That is, the extractor 213-4-*n* extracts a sample $s(t_3 \pm nT)$. Concerning this sample, an equation obtained by replacing T included in equation (11) with nT holds.

The average calculator 214-1-*n* receives the samples from the extractors 213-1-*n* and 213-2-*n*. The average calculator 214-1-*n* unifies the signs of the input samples to the plus or minus sign, calculates the average value, and outputs the calculated average value (to be referred to as a first average sample hereinafter) to a phase calculator 215-*n*. The average value represents $A \cos(2\pi(f+\Delta f)nT)$ or a sign-inverted value thereof. A reliable calculation result can be obtained by averaging the plurality of samples. Note that the average calculator 214-1-*n* may be replaced with a sum calculator. In this case, the phase calculator 215-*n* needs to divide the sum. Alternatively, the average calculator 214-1-*n* may be replaced with a selector that selects one of the input samples.

The average calculator 214-2-*n* receives the samples from the extractors 213-3-*n* and 213-4-*n*. The average calculator 214-2-*n* unifies the signs of the input samples to the plus or minus sign, calculates the average value, and outputs the calculated average value (to be referred to as a second average sample hereinafter) to the phase calculator 215-*n*. The average value represents $A \sin(2\pi(f+\Delta f)nT)$ or a sign-inverted value thereof. A reliable calculation result can be obtained by averaging the plurality of samples. Note that the average calculator 214-2-*n* may be replaced with a sum calculator. In this case, the phase calculator 215-*n* needs to divide the sum. Alternatively, the average calculator 214-2-*n* may be replaced with a selector that selects one of the input samples.

The phase calculator 215-*n* receives the first average sample from the average calculator 214-1-*n*, and receives the second average sample from the average calculator 214-2-*n*. Using the first average sample and the second average sample, the phase calculator 215-*n* calculates a phase change in the digital baseband signal throughout n periods of the predetermined period. The phase calculator 215-*n* outputs a phase signal representing the calculated phase change to the frequency error calculator 216. More specifically, the phase calculator 215-*n* may calculate a phase change $\Delta p_n$ by performing an operation based on an inverse tangent function given by an equation obtained by replacing $\Delta f$, $\Delta p$, and T included in equation (12) with $\Delta f_n$, $\Delta p$, and nT, respectively.

The frequency error calculator 216 receives the phase signals from the phase calculators 215-1, ..., 215-M, and receives an offset signal from the offset signal generator 117. The frequency error calculator 216 calculates an frequency error $\Delta f_n$ using the phase changes $\Delta p_n$ represented by the phase signals and an offset frequency f represented by the offset signal in accordance with an equation obtained by replacing $\Delta f$, $\Delta p$, and T included in equation (13) with $\Delta f_n$, $\Delta p_n$, and nT, respectively. The frequency error calculator 216 also calculates the average value of frequency errors $\Delta f_1, \ldots, \Delta f_K$ as the frequency error $\Delta f$. A reliable calculation result can be obtained by deriving the plurality of frequency error candidates and averaging them. The frequency error calculator 216 feeds back a frequency error signal representing the calculated frequency error Δf to the local oscillator 103.

Figure 5:
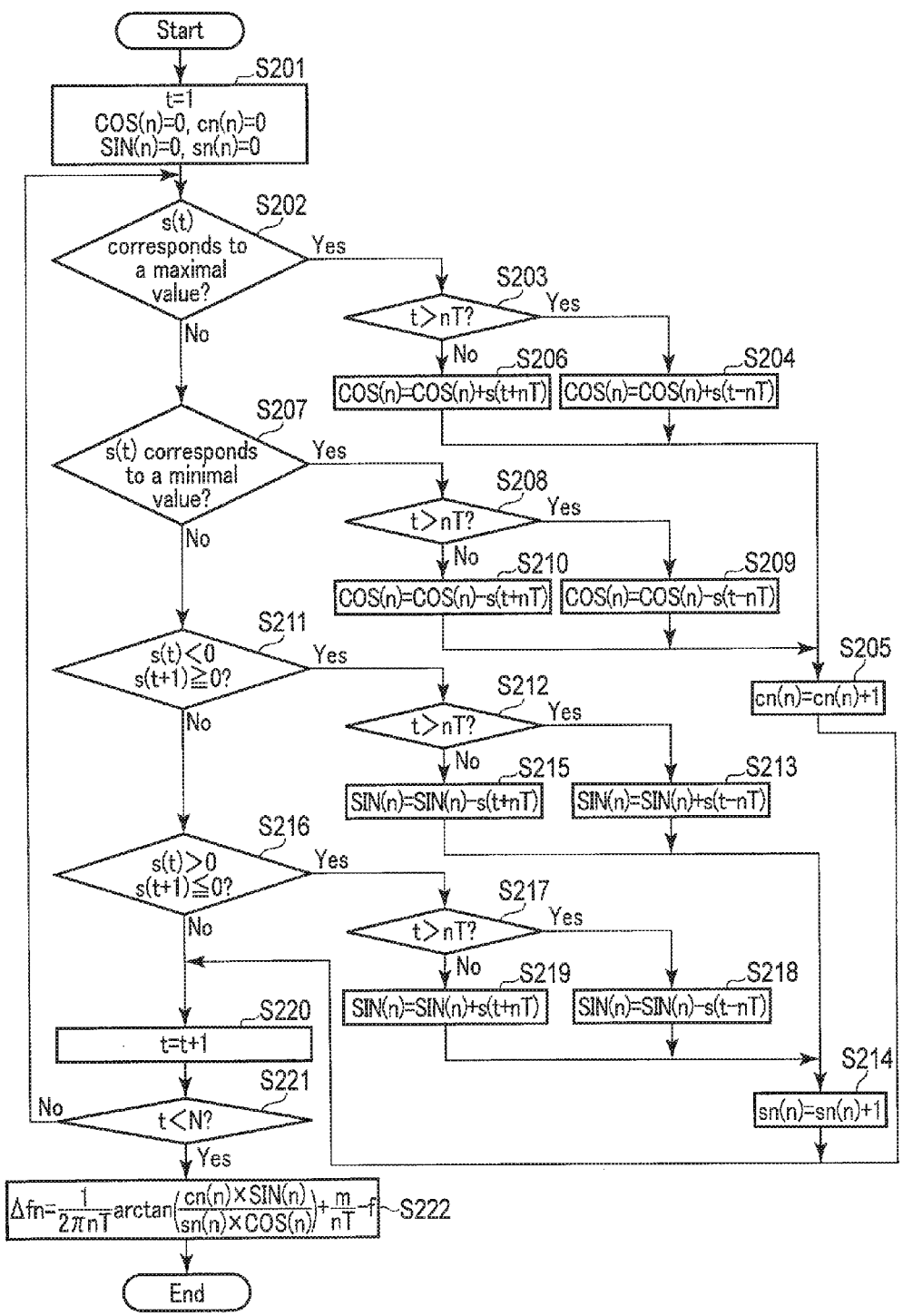
FIG. 5 is a flowchart showing the operation of an AFC circuit shown in FIG. 4.

The AFC circuit 210 operates as shown in FIG. 5. First, the AFC circuit 210 initializes a variable t representing the number of symbols to 1, and also initializes a variable COS(n) used to hold the sum of candidate values of A cos(2π(f+Δf)nT), a variable cn(n) used to hold the total number of candidate values, a variable SIN(n) used to hold the sum of candidate values of A sin(2π(f+Δf)nT), and a variable sn(n) used to hold the total number of candidate values to 0 (step S201). Next, the process advances to step S202. Note that steps S202, S207, S211, and S216 may be executed in an order different from that shown in FIG. 5 or may be executed in parallel.

In step S202, the first time detector 111-1 determines whether the digital baseband signal s(t) exhibits the maximal value. Upon determining that the digital baseband signal s(t) exhibits the maximal value, the process advances to step S203. Otherwise, the process advances to step S207.

In step S203, the time shifter 212-1-n determines whether t is larger than nT. If t is larger than nT, s(t−nT) exists. Hence, the time shifter 212-1-n subtracts nT from t, and the process advances to step S204. If t is equal to or smaller than nT, s(t−nT) does not exist. Hence, the time shifter 212-1-n adds nT to t, and the process advances to step S206.

In step S204, the extractor 213-1-n extracts the sample s(t−nT), and the average calculator 214-1-n adds the extracted sample s(t−nT) to the variable COS(n). The process then advances to step S205. In step S205, the average calculator 214-1-n increments the variable cn(n) by 1, and the process advances to step S220. In step S206, the extractor 213-1-n extracts the sample s(t+nT), and the average calculator 214-1-n adds the extracted sample s(t+nT) to the variable COS(n). The process then advances to step S205.

In step S207, the second time detector 111-2 determines whether the digital baseband signal s(t) exhibits the minimal value. Upon determining that the digital baseband signal s(t) exhibits the minimal value, the process advances to step S208. Otherwise, the process advances to step S211.

In step S208, the time shifter 212-2-n determines whether t is larger than nT. If t is larger than nT, s(t−nT) exists. Hence, the time shifter 212-2-n subtracts nT from t, and the process advances to step S209. If t is equal to or smaller than nT, s(t−nT) does not exist. Hence, the time shifter 212-2-n adds nT to t, and the process advances to step S210.

In step S209, the extractor 213-2-n extracts the sample s(t−nT), and the average calculator 214-1-n inverts the sign of the extracted sample s(t−nT) and adds it to the variable COS(n). The process then advances to step S205. In step S210, the extractor 213-2-n extracts the sample s(t+nT), and the average calculator 214-1-n inverts the sign of the extracted sample s(t+nT) and adds it to the variable COS(n). The process then advances to step S205.

In step S211, the third time detector 111-3 determines whether the digital baseband signal s(t) exhibits the positive zero-crossing. Upon determining that the digital baseband signal s(t) exhibits the positive zero-crossing, the process advances to step S211. Otherwise, the process advances to step S216.

In step S212, the time shifter 212-3-n determines whether t is larger than nT. If t is larger than nT, s(t−nT) exists. Hence, the time shifter 212-3-n subtracts nT from t, and the process advances to step S213. If t is equal to or smaller than nT, s(t−nT) does not exist. Hence, the time shifter 212-3-n adds nT to t, and the process advances to step S215.

In step S213, the extractor 213-3-n extracts the sample s(t−nT), and the average calculator 214-2-n adds the extracted sample s(t−nT) to the variable SIN(n). The process then advances to step S214. In step S214, the average calculator 214-2-n increments the variable sn(n) by 1, and the process advances to step S220. In step S215, the extractor 213-3-n extracts the sample s(t+nT), and the average calculator 214-2-n inverts the sign of the extracted sample s(t+nT) and adds it to the variable SIN(n). The process then advances to step S214.

In step S216, the fourth time detector 111-4 determines whether the digital baseband signal s(t) exhibits the negative zero-crossing. Upon determining that the digital baseband signal s(t) exhibits the negative zero-crossing, the process advances to step S217. Otherwise, the process advances to step S220.

In step S217, the time shifter 212-4-n determines whether t is larger than nT. If t is larger than nT, s(t−nT) exists. Hence, the time shifter 212-4-n subtracts nT from t, and the process advances to step S218. If t is equal to or smaller than nT, s(t−nT) does not exist. Hence, the time shifter 212-4-n adds nT to t, and the process advances to step S219.

In step S218, the extractor 213-4-n extracts the sample s(t−nT), and the average calculator 214-2-n inverts the sign of the extracted sample s(t−nT) and adds it to the variable SIN(n). The process then advances to step S214. In step S219, the extractor 213-4-n extracts the sample s(t+nT), and the average calculator 214-2-n adds the extracted sample s(t+nT) to the variable SIN(n). The process then advances to step S214.

In step S220, the AFC circuit 210 increments t by 1. Next, the AFC circuit 210 determines whether t is smaller than N (step S221). N is the number of samples usable for calculation of the frequency error $\Delta f_n$. If t is smaller than N, the process advances to step S222. Otherwise, the process returns to step S202.

In step S222, the phase calculator 215-n and the frequency error calculator 216 calculate the frequency error $\Delta f_n$ in accordance with equations (12) and (13). The frequency error calculator 216 also calculates the average values of the frequency errors $\Delta f_n$ as the frequency error Δf. After step S222, the processing shown in FIG. 5 ends.

FIG. 6 shows the effect of the receiver according to this embodiment. FIG. 6 shows a simulation result of the frequency error Δf calculated by the receiver. In the example of FIG. 6, the offset frequency f is set to 500 kHz, and the SNR (Signal-to-Noise Ratio) is set to 10 dB. The set value of the offset frequency f meets the condition represented by inequality (3) throughout the time. In FIG. 6, the abscissa represents the set value of the frequency error (that is, a correct frequency error), and the ordinate represents rms (root mean square) of the calculation error with respect to the set value of the calculated frequency error Δf. The simulation is conducted 1,000 times for each set value.

In the example of FIG. 6, if the frequency error Δf falls within the range of about −150 kHz to +150 kHz, the calculation error is suppressed and is small. On the other hand, the calculation error abruptly increases within the range of about −250 kHz or less or within the range of about +250 kHz or more. The cause of this phenomenon is assumed to be the above-described 2π cycle error.

As described above, the receiver according to the second embodiment generates a digital baseband signal using one analog baseband circuit system, calculates the phase of the digital baseband signal in the digital domain, and calculates the frequency error of the local frequency based on the phase. Hence, according to the receiver, it is possible to make the local frequency follow a desired frequency without using two analog baseband circuit systems. In addition, the receiver can improve the reliability of the calculation result by deriving a plurality of frequency error candidates and averaging them.

Third Embodiment

As shown in FIG. 7, a receiver according to the third embodiment includes an antenna 100, a low noise amplifier 101, a mixer 102, a local oscillator 103, an amplifier 104, a filter 105, an ADC 106, and an AFC circuit 310.

The ADC 106 shown in FIG. 7 is different from the ADC 106 shown in FIG. 1 in that a digital baseband signal is output to the AFC circuit 310. The local oscillator 103 shown in FIG. 7 is different from the local oscillator 103 shown in FIG. 1 in that an offset frequency signal and a frequency error signal are received from the AFC circuit 310.

The AFC circuit 310 is different from the AFC circuit 110 shown in FIG. 1 and the AFC circuit 210 shown in FIG. 4 in the frequency error calculation method. The AFC circuit 310 includes a numerator calculator 311, a denominator calculator 312, a divider 313, a calibration signal generating circuit 314, an LUT generating circuit 315, an LUT storage 316, a frequency difference estimator 317, a frequency error calculator 318, and an offset signal generator 117. The offset signal generator 117 shown in FIG. 7 is different from the offset signal generator 117 shown in FIG. 1 in that an offset signal is output to the frequency error calculator 318.

The numerator calculator 311, the denominator calculator 312, and the divider 313 can also be called an index parameter calculator. The index parameter is the value of a monotone increasing function (or monotone decreasing function) to a frequency difference $f_d$ (=f+Δf) between a carrier frequency and a local frequency. Before the start of AFC (to be referred to as the time of LUT generation hereinafter), the AFC circuit 310 calculates an index parameter corresponding to each of a plurality of frequency differences $f_d$ using a calibration signal in which the frequency difference $f_d$ is set, and generates an LUT in which a plurality of combinations of the frequency differences $f_d$ and corresponding index parameters are registered. At the time of AFC, the AFC circuit 310 calculates an index parameter based on a digital baseband signal corresponding to a known signal, estimates the frequency difference $f_d$ corresponding to the index parameter using the LUT, and calculates a frequency error Δf based on the estimated frequency difference $f_d$.

More specifically, with respect to the monotone increasing function to the frequency difference $f_d$ (=f+Δf), an index parameter h given by $$h = \frac{\sum_{t=1}^{N} s''^2(t)}{\sum_{t=1}^{N} s^2(t)} \tag{14}$$

is usable, where s"(t) is the second-order derivative of a digital baseband signal s(t), which is given by $$s''(t) = -A(2\pi f_d + \phi'(t))^2 \cos(2\pi f_d t + \phi(t) + \phi_0) - A\phi''(t)\sin(2\pi f_d t + \phi(t) + \phi_0) \tag{15}$$

At the time of LUT generation, the numerator calculator 311 receives a calibration signal that simulates the digital baseband signal s(t) corresponding to a known signal from the calibration signal generating circuit 314. On the other hand, at the time of AFC, the numerator calculator 311 receives the digital baseband signal s(t) based on a reception signal from the ADC 106. In any case, the numerator calculator 311 calculates, for example, the numerator term of equation (14) using the digital baseband signal s(t), and outputs a first digital value representing the numerator term to the divider 313. More specifically, the numerator calculator 311 includes a second-order differentiator 311-1, a $2n^{th}$-power calculator 311-2, and an integrator 311-3.

The second-order differentiator 311-1 calculates the second-order derivative s"(t) of the digital baseband signal s(t). The $2n^{th}$-power calculator 311-2 calculates a $2n^{th}$-power value $s''^{2n}(t)$ of the second-order derivative s"(t). Here, n can be an arbitrary natural number and is assumed to be 1 in the following explanation. The integrator 311-3 integrates a second-power value $s''^2(t)$ (that is, calculates the sum), thereby obtaining the first digital value representing the numerator term.

The second-power value $s''^2(t)$ can be broken down to $h_1(t)$ and $h_2(t)$, as indicated by $$\begin{aligned}
s''^2(t) &= h_1(t) + h_2(t) \\
h_1(t) &= \frac{1}{2}A^2(2\pi f_d + \phi'(t))^4 + \frac{1}{2}A^2\phi''^2(t) \\
h_2(t) &= \frac{1}{2}A^2((2\pi f_d + \phi'(t))^4 - \phi''^2(t))\cos(4\pi f_d t + 2\phi(t) + 2\phi_0) + \\
&\quad A^2(2\pi f_d + \phi'(t))^2 \phi''(t)\sin(4\pi f_d t + 2\phi(t) + 2\phi_0)
\end{aligned} \tag{16}$$

Here, $h_1(t)$ is a positive number whose integral value monotonously increases with respect to a time t. On the other hand, $h_2(t)$ has a periodicity and iterates positive and negative values, and its integral value therefore changes a little even when the time t increases. Hence, the integral value of the second-power value $s''^2(t)$ can be approximated by the integral value of $h_1(t)$, as indicated by $$\sum_{t=1}^{N} s''^2(t) \approx \sum_{t=1}^{N} h_1(t) = \frac{1}{2}A^2 \sum_{t=1}^{N} ((2\pi f_d + \phi'(t))^4 + \phi''^2(t)) \tag{17}$$

At the time of LUT generation, the denominator calculator 312 receives the calibration signal as the digital baseband signal s(t) from the calibration signal generating circuit 314. On the other hand, at the time of AFC, the denominator calculator 312 receives the digital baseband signal s(t) based on the reception signal from the ADC 106. In any case, the denominator calculator 312 calculates, for example, the denominator term of equation (14) using the digital baseband signal s(t), and outputs a second digital value representing the denominator term to the divider 313. More specifically, the denominator calculator 312 includes a $2n^{th}$-power calculator 312-1 and an integrator 312-2.

The $2n^{th}$-power calculator 312-1 calculates a $2n^{th}$-power value $s^{2n}(t)$ of the digital baseband signal s(t). Here, n can be an arbitrary natural number and is assumed to be 1 in the following explanation. The integrator 312-2 integrates a second-power value $s^2(t)$ (that is, calculates the sum), thereby obtaining the second digital value representing the denominator term.

The second-power value $s^2(t)$ can be broken down to $h_3(t)$ and $h_4(t)$, as indicated by $$s^2(t) = h_3(t) + h_4(t) \quad (18)$$

$$h_3(t) = \frac{1}{2}A^2$$

$$h_4(t) = \frac{1}{2}A^2\cos(4\pi f_d t + 2\phi(t) + 2\phi_0)$$

Here, $h_3(t)$ is a positive number whose integral value monotonously increases with respect to the time t. On the other hand, $h_4(t)$ has a periodicity and iterates positive and negative values, and its integral value therefore changes a little even when the time t increases. Hence, the integral value of the second-power value $s^2(t)$ can be approximated by the integral value of $h_3(t)$, as indicated by $$\sum_{t=1}^{N} s^2(t) \approx \sum_{t=1}^{N} h_3(t) = \frac{N}{2}A^2 \quad (19)$$

The divider 313 receives the first digital value representing the numerator term from the numerator calculator 311, and receives the second digital value representing the denominator term from the denominator calculator 312. The divider 313 divides the first digital value by the second digital value, thereby obtaining an index parameter. At the time of LUT generation, the divider 313 outputs the index parameter to the LOT generating circuit 315. On the other hand, at the time of AFC, the divider 313 outputs the index parameter to the frequency difference estimator 317.

The index parameter can be approximated using equations (17) and (19), as indicated by equation (20) below. The approximate value can further be broken down to $h_5$ and $h_6$.

$$h = \frac{\sum_{t=1}^{N} s''^2(t)}{\sum_{t=1}^{N} s^2(t)} \approx \frac{1}{N}\sum_{t=1}^{N}((2\pi f_d + \phi'(t))^4 + \phi''^2(t)) \quad (20)$$

$$h \approx h_5 + h_6$$

$$h_5 = \frac{1}{N}\left((2\pi)^4 \sum_{t=1}^{N} f_d^4 + 6(2\pi)^2 \sum_{t=1}^{N} f_d^2 \phi'^2(t) + \sum_{t=1}^{N} (\phi'^4(t) + \phi''^2(t))\right)$$

$$h_6 = \frac{1}{N}\left(4(2\pi)^3 \sum_{t=1}^{N} f_d^3 \phi'(t) + 4(2\pi) \sum_{t=1}^{N} f_d^2 \phi'^3(t)\right)$$

Figure 10:
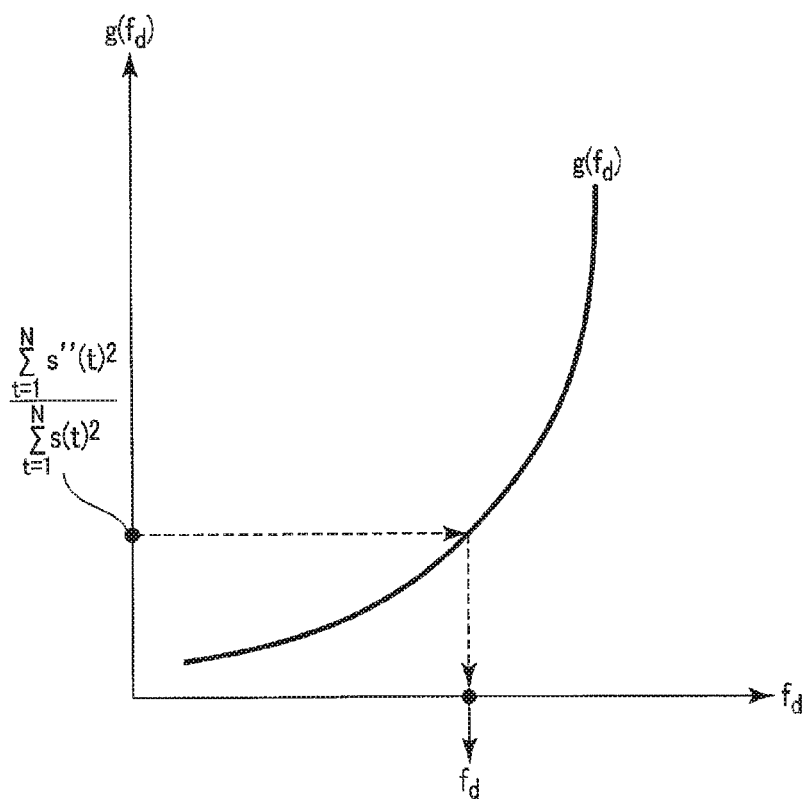
FIG. 10 is a graph showing the relationship between an index parameter and a frequency difference calculated by the AFC circuit shown in FIG. 7.

Here, $h_5$ and $h_6$ do not depend on an amplitude component A of the digital baseband signal s(t). In addition, since $\phi(t)$ is a periodic function having a period of a time length T, its derivative $\phi'(t)$ is also a periodic function having a period of the time length T. Hence, if an integration time N is an integer multiple of the time length T, $h_6$ can be approximated to 0. On the other hand, $h_5$ monotonously increases with respect to the frequency difference $f_d$. The larger the frequency difference $f_d$ is, the smaller the influence of $\phi(t)$ is. Hence, as shown in FIG. 10, h can be handled as a monotone increasing function $g(f_d)$ to the frequency difference $f_d$. That is, the frequency difference $f_d$ can be estimated from the index parameter h using relationships $g(f_d)=h$, and $g^{-1}(h)=f_d$.

At the time of LUT generation, the calibration signal generating circuit 314 generates the calibration signal that simulates the digital baseband signal s(t) corresponding to a known signal, and outputs it to the numerator calculator 311 and the denominator calculator 312. The frequency difference $f_d$ and an initial phase difference $\phi_0$ to be set in the calibration signal are designated by, for example, the LUT generating circuit 315.

At the time of LUT generation, the LUT generating circuit 315 receives the index parameter from the divider 313. The LUT generating circuit 315 registers the combination of the frequency difference $f_d$ set in the calibration signal used to calculate the index parameter and the index parameter in the LUT stored in the LUT storage 316. Note that according to equations (20), $h_5$ does not depend on the initial phase difference $\phi_0$. However, since the known signal used to calculate the index parameter at the time of AFC has a finite length, $h_2(t)$ and $h_4(t)$ described above are not so small as to be negligible as compared to $h_1(t)$ and $h_3(t)$, respectively. That is, the actually calculated index parameter changes depending on not only the frequency difference $f_d$ but also the initial phase difference $\phi_0$. For this reason, the LUT generating circuit 315 preferably registers, in the LUT, the average value of index parameters obtained by changing the initial phase difference $\phi_0$ set in the calibration signal from 0 to $2\pi$ for each frequency difference $f_d$.

The LUT storage 316 stores the LUT generated by the LUT generating circuit 315. The LUT stored in the LUT storage 316 is referred to as needed by the frequency difference estimator 317.

At the time of AFC, the frequency difference estimator 317 receives the (current) index parameter from the divider 313. The frequency difference estimator 317 searches the LUT stored in the LUT storage 316 using the index parameter, thereby estimating the (current) frequency difference $f_d$ corresponding to the index parameter. The frequency difference estimator 317 outputs a frequency difference signal representing the estimated frequency difference $f_d$ to the frequency error calculator 318.

The frequency error calculator 318 receives the frequency difference signal from the frequency difference estimator 317, and receives an offset signal from the offset signal generator 117. The frequency error calculator 318 subtracts an offset frequency f represented by the offset signal from the frequency difference $f_d$ represented by the frequency difference signal, thereby calculating the frequency error $\Delta f$. The frequency error calculator 318 feeds back a frequency error signal representing the calculated frequency error $\Delta f$ to the local oscillator 103.

At the time of LUT generation, the AFC circuit 310 operates as shown in FIG. 8. First, the LUT generating circuit 315 initializes the frequency difference $f_d$ to be set in the calibration signal to a predetermined lower limit value $f_{min}$ (step S301), and the process advances to step S302. In step S302, the LUT generating circuit 315 initializes the initial phase difference $\phi_0$ to be set in the calibration signal to 0, and the process advances to step S303.

In step S303, the calibration signal generating circuit 314 generates the calibration signal as the digital baseband signal s(t). Next, the numerator calculator 311, the denominator calculator 312, and the divider 313 (i.e., the index parameter calculator) calculate an index parameter based on the calibration signal generated in step S303 (step S304).

The LUT generating circuit 315 then temporarily stores the index parameter calculated in step S304, and increments the initial phase difference $\phi_0$ to be set in the calibration signal by an adjustment width $\phi_{step}$ (step S305). After step S305, if the initial phase difference $\phi_0$ is smaller than $2\pi$, the process returns to step S303. Otherwise, the process advances to step S307 (step S306).

In step S307, the LUT generating circuit 315 calculates the average value of a plurality of index parameters collected via loop processing from step S303 to step S306. The LUT generating circuit 315 registers the average value calculated in step S307 in the LOT in combination with the (current) frequency difference $f_d$ (step S308).

Next, the LUT generating circuit 315 increments the frequency difference $f_d$ to be set in the calibration signal by an adjustment width $f_{step}$ (step S309). After step S309, if the frequency difference $f_d$ is equal to or smaller than a predetermined upper limit value $f_{max}$, the process returns to step S302. Otherwise, the processing shown in FIG. 8 ends (step S310).

Figure 9:
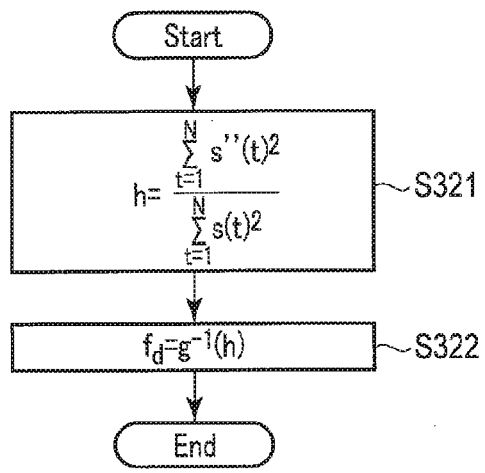
FIG. 9 is a flowchart showing the operation of the AFC circuit shown in FIG. 7 at the time of AFC.

At the time of AFC, the AFC circuit 310 operates as shown in FIG. 9. First, the numerator calculator 311, the denominator calculator 312, and the divider 313 calculate the index parameter h using the digital baseband signal s(t) based on the reception signal (step S321). Next, the frequency difference estimator 317 searches the LUT stored in the LUT storage 316 using the index parameter calculated in step S321, thereby estimating the frequency difference $f_d$ corresponding to the index parameter (step S322). The frequency error calculator 318 then subtracts the offset frequency f represented by the offset signal from the frequency difference $f_d$ estimated in step S322, thereby calculating the frequency error $\Delta f$. The processing shown in FIG. 9 thus ends.

FIG. 11 shows the effect of the receiver according to this embodiment. FIG. 11 shows a simulation result of the frequency error $\Delta f$ calculated by the receiver. In the example of FIG. 11, the offset frequency f is set to 500 kHz, and the SNR is set to 10 dB, as in the example of FIG. 6. The set value of the offset frequency f meets the condition represented by inequality (3) throughout the time. In FIG. 11, the abscissa represents the set value of the frequency error (that is, a correct frequency error), and the ordinate represents the rms of the calculation error with respect to the set value of the calculated frequency error $\Delta f$. The simulation is conducted 1,000 times for each set value.

In the example of FIG. 11, the calculation accuracy of the frequency error $\Delta f$ lowers within the range of about −150 kHz to +150 kHz, as compared to the example of FIG. 6. The cause of this phenomenon is supposed to be a calculation error caused by the influence of the initial phase difference $\phi_0$. On the other hand, in the example of FIG. 11, since an inverse tangent function that causes a $2\pi$ cycle error is not used, an abrupt increase in the calculation error within the range of about −250 kHz or less or within the range of about +250 kHz or more, which is observed in the example of FIG. 6, does not occur. Note that in the example of FIG. 11, the smaller the frequency error $\Delta f$ is, the larger the calculation error when the frequency error $\Delta f$ falls within the range of about +50 kHz or less. This phenomenon probably occurs because when the frequency difference $f_d$ becomes small (approaches zero), the influence of $h_2(t)$ and $h_4(t)$ in the numerator term and the denominator term becomes relatively large.

As described above, the receiver according to the third embodiment generates an LUT by accumulating, in advance, a combination of an index parameter calculated based on a calibration signal in which a predetermined frequency difference is set and the frequency difference. At the time of AFC, the receiver generates a digital baseband signal using one analog baseband circuit system, calculates an index parameter based on a reception signal, and searches the LUT using the index parameter, thereby estimating a frequency difference corresponding to the index parameter. Hence, according to the receiver, it is possible to make the local frequency follow a desired frequency without using two analog baseband circuit systems. In addition, since an inverse tangent function is not used, the receiver can calculate a frequency error without including a $2\pi$ cycle error over a wide frequency range. It is therefore possible to implement cost reduction by relaxing the accuracy requirement of frequency stability of the oscillator included in the receiver.

Fourth Embodiment

As shown in FIG. 12, a receiver according to the fourth embodiment includes an antenna 100, a low noise amplifier 101, a mixer 102, a local oscillator 103, an amplifier 104, a filter 105, an ADC 106, and an AFC circuit 410.

The ADC 106 shown in FIG. 12 is different from the ADC 106 shown in FIG. 1 in that a digital baseband signal is output to the AFC circuit 410. The local oscillator 103 shown in FIG. 12 is different from the local oscillator 103 shown in FIG. 1 in that an offset frequency signal and a frequency error signal are received from the AFC circuit 410.

The AFC circuit 410 is different from the AFC circuit 310 shown in FIG. 7 in that an LUT is not internally generated, and an externally generated LUT is stored in an LUT storage 416. The AFC circuit 410 includes a numerator calculator 311, a denominator calculator 312, a divider 313, the LUT storage 416, a frequency difference estimator 317, a frequency error calculator 318, and an offset signal generator 117.

At the time of AFC, the numerator calculator 311, the denominator calculator 312, the divider 313, the frequency difference estimator 317, and the frequency error calculator 318 shown in FIG. 12 operate like the numerator calculator 311, the denominator calculator 312, the divider 313, the frequency difference estimator 317, and the frequency error calculator 318 shown in FIG. 7. The offset signal generator 117 shown in FIG. 12 is different from the offset signal generator 117 shown in FIG. 1 in that an offset signal is output to the frequency error calculator 318.

The LUT storage 416 stores an LUT generated in advance outside the receiver shown in FIG. 12. The LUT may be generated via, for example, a computer simulation. The LUT stored in the LUT storage 416 is referred to as needed by the frequency difference estimator 317.

As described above, the receiver according to the fourth embodiment stores, in the storage, an LUT generated outside the receiver by accumulating, in advance, a combination of an index parameter calculated based on a calibration signal in which a predetermined frequency difference is set and the frequency difference. At the time of AFC, the receiver generates a digital baseband signal using one analog baseband circuit system, calculates an index parameter based on a reception signal, and searches the LUT using the index parameter, thereby estimating a frequency difference corresponding to the index parameter. Hence, according to the receiver, it is possible to make the local frequency follow a desired frequency without using two analog baseband circuit systems. In addition, since an inverse tangent function is not used, the receiver can calculate a frequency error without including a $2\pi$ cycle error over a wide frequency range. It is therefore possible to implement cost reduction by relaxing the accuracy requirement of frequency stability of the oscillator included in the receiver. Furthermore, according to the receiver, since circuits corresponding to the calibration signal generating circuit and the LUT generating circuit are unnecessary, the implementation can be simplified, as compared to the third embodiment.

Fifth Embodiment

A receiver according to the fifth embodiment combines the AFC circuit (to be referred to as a first AFC circuit hereinafter) of the receiver according to the above-described first or second embodiment and the AFC circuit (to be referred to as a second AFC circuit hereinafter) of the receiver according to the above-described third or fourth embodiment, thereby accurately calculating a frequency error $\Delta f$ over a wide frequency range.

Generally speaking, the first AFC circuit can accurately calculate a frequency error (to be referred to as a frequency error $\Delta f1$ hereinafter) within a limited frequency range. However, if the absolute value of the frequency error $\Delta f1$ becomes large to some extent, the calculation error abruptly increases because of a $2\pi$ cycle error. On the other hand, the second AFC circuit can calculate a frequency error (to be referred to as a frequency error $\Delta f2$ hereinafter) without a $2\pi$ cycle error because an inverse tangent function is not used. The receiver according to this embodiment compares the frequency error $\Delta f1$ and the frequency error $\Delta f2$ calculated by the two AFC circuits. If the absolute value of the difference between them exceeds a threshold, it is determined that the frequency error $\Delta f1$ includes a $2\pi$ cycle error. The $2\pi$ cycle error included in the frequency error $\Delta f1$ is corrected so as to be canceled, thereby implementing accurate calculation.

For example, the receiver according to this embodiment includes an antenna 100, a low noise amplifier 101, a mixer 102, a local oscillator 103, an amplifier 104, a filter 105, an ADC 106, an AFC circuit 110, an AFC circuit 310, and a calculation error correction circuit.

The AFC circuit 110 to be described in this embodiment is different from the AFC circuit 110 shown in FIG. 1 in that a first frequency error signal representing the frequency error $\Delta f1$ is output to the calculation error correction circuit. The AFC circuit 310 to be described in this embodiment is different from the AFC circuit 310 shown in FIG. 7 in that a second frequency error signal representing the frequency error $\Delta f2$ is output to the calculation error correction circuit. Note that an offset signal generator 117 included in the AFC circuit 110 and that included in the AFC circuit 310 may be implemented by one common offset signal generator.

The calculation error correction circuit receives the first frequency error signal from the AFC circuit 110, and receives the second frequency error signal from the AFC circuit 310. The calculation error correction circuit calculates the difference between the frequency error $\Delta f1$ represented by the first frequency error signal and the frequency error $\Delta f2$ represented by the second frequency error signal. If the absolute value of the difference is equal to or smaller than the threshold, the calculation error correction circuit determines that the frequency error $\Delta f1$ does not include a $2\pi$ cycle error, and directly feeds back the frequency error $\Delta f1$ to the local oscillator 103 as the frequency error $\Delta f$. On the other hand, if the absolute value of the difference is larger than the threshold, the calculation error correction circuit determines that the frequency error $\Delta f1$ includes a $2\pi$ cycle error, and cancels the $2\pi$ cycle error from the frequency error $\Delta f1$.

More specifically, if frequency error $\Delta f1$>frequency error $\Delta f2$, the calculation error correction circuit handles a value obtained by subtracting a correction value $\Delta f0$ from the frequency error $\Delta f1$ as the frequency error $\Delta f$ after correction. The correction value $\Delta f0$ is designed so as to match a change ($=1/T$) in the frequency error $\Delta f$ in a case in which, for example, the phase is shifted by $2\pi$. On the other hand, if frequency error $\Delta f1$≤frequency error $\Delta f2$, the calculation error correction circuit handles a value obtained by adding the correction value $\Delta f0$ to the frequency error $\Delta f1$ as the frequency error $\Delta f$ after correction. The calculation error correction circuit feeds back a frequency error signal representing the frequency error $\Delta f$ after correction to the local oscillator 103.

The AFC circuit 110, the AFC circuit 310, and the calculation error correction circuit included in the receiver according to this embodiment operate as shown in FIG. 13. The AFC circuit 110 and the AFC circuit 310 calculate the frequency error $\Delta f1$ and the frequency error $\Delta f2$, respectively (steps S401 and S402). Note that steps S401 and S402 may be executed in an order different from that shown in FIG. 13 or may be executed in parallel. After steps S401 and S402, the process advances to step S403.

In step S403, the calculation error correction circuit subtracts the frequency error $\Delta f2$ calculated in step S402 from the frequency error $\Delta f1$ calculated in step S401, thereby obtaining a difference $\epsilon$. Next, the calculation error correction circuit determines whether the absolute value of the difference $\epsilon$ calculated in step S403 is larger than a threshold $\epsilon 0$ (>0) (step S404). If the absolute value of the difference $\epsilon$ is larger than the threshold $\epsilon 0$, the process advances to step S406. Otherwise, the process advances to step S405.

In step S405, the calculation error correction circuit directly feeds back the frequency error $\Delta f1$ to the local oscillator 103 as the frequency error $\Delta f$, and the processing shown in FIG. 13 ends. In step S406, the calculation error correction circuit determines whether the difference $\epsilon$ calculated in step S403 is larger than 0. If $\epsilon$ is larger than 0, the process advances to step S408. Otherwise, the process advances to step S407.

In step S407, the calculation error correction circuit feeds back a value obtained by subtracting the correction value $\Delta f0$ from the frequency error $\Delta f1$ to the local oscillator 103 as the corrected frequency error $\Delta f$, and the processing shown in FIG. 13 ends. In step S408, the calculation error correction circuit feeds back a value obtained by adding the correction value $\Delta f0$ to the frequency error $\Delta f1$ to the local oscillator 103 as the corrected frequency error $\Delta f$, and the processing shown in FIG. 13 ends.

FIG. 13 shows the effect of the receiver according to this embodiment. FIG. 13 shows a simulation result of the frequency error $\Delta f$ calculated by the receiver. In the example of FIG. 13, an offset frequency f is set to 500 kHz, and the SNR is set to 10 dB, as in the example of FIG. 6. The set value of the offset frequency f meets the condition represented by inequality (3) throughout the time. In FIG. 13, the abscissa represents the set value of the frequency error (that is, a correct frequency error), and the ordinate represents the rms of the calculation error with respect to the set value of the calculated frequency error $\Delta f$. The simulation is conducted 1,000 times for each set value. In the example of FIG. 13, the calculation error is maintained small by correction to cancel a $2\pi$ cycle error even if the frequency error $\Delta f$ falls within the range of about +250 kHz or more, as compared to the example of FIG. 6.

Note that according to the example of FIG. 11, the calculation accuracy of the frequency error $\Delta f2$ is not necessarily high when the frequency error $\Delta f2$ is almost −250 kHz. Hence, in the example of FIG. 13, within the frequency range of frequency error $\Delta f<0$, the frequency error $\Delta f1$ is directly handled as the frequency error $\Delta f$ without causing the calculation error correction circuit to function. However, the calculation accuracy of the frequency error $\Delta f2$ can be improved by improving the SNR, setting the offset frequency f high, or setting the signal length used to calculate the frequency error Δf2 long. Hence, the calculation error correction circuit can be caused to function even within the frequency range of frequency error Δf<0.

As described above, if the first frequency error calculated by the first AFC circuit of the receiver according to the first or second embodiment includes a 2π cycle error, the receiver according to the fifth embodiment performs correction so as to cancel the 2π cycle error. More specifically, based on the magnitude of the absolute value of the difference between the first frequency error and the second frequency error calculated by the second AFC circuit of the receiver according to the third or fourth embodiment, the receiver determines whether the first frequency error includes a 2π cycle error. Hence, according to the receiver, it is possible to accurately calculate a frequency error over a wide frequency range. That is, it is possible to implement cost reduction by relaxing the accuracy requirement of frequency stability of the oscillator included in the receiver. Additionally, according to the receiver, it is possible to make the local frequency follow a desired frequency without using two analog baseband circuit systems, as in the above-described first to fourth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An auto frequency control circuit for controlling an oscillation frequency of a local oscillator that generates a local signal, the circuit comprising:
   an offset signal generator that generates an offset signal representing an offset frequency to be set in the local oscillator such that a phase of a digital signal corresponding to iteration of a known symbol having a predetermined period monotonously increases with respect to a time, and feeds back the offset signal to the local oscillator;
   a peak time detector that detects, from the digital signal, a first time at which the digital signal exhibits one of a maximal value and a minimal value;
   a first time shifter that adds or subtracts a first natural number multiple of the predetermined period to or from the first time to obtain a first extraction timing;
   a first extractor that extracts a first sample corresponding to the first extraction timing from the digital signal;
   a zero-crossing time detector that detects, from the digital signal, a second time at which the digital signal exhibits one of a positive zero-crossing and a negative zero-crossing;
   a second time shifter that adds or subtracts the first natural number multiple of the predetermined period to or from the second time to obtain a second extraction timing;
   a second extractor that extracts a second sample corresponding to the second extraction timing from the digital signal;
   a first phase calculator that calculates a first phase change of the digital signal over the first natural number multiple of the predetermined period by performing an operation based on an inverse tangent function using the first sample and the second sample; and
   a frequency error calculator that calculates a frequency error of the digital signal using the first phase change and the offset frequency, and feeds back the frequency error to the local oscillator,
   wherein the digital signal is generated by down-converting a constant envelope modulation signal using the local signal and analog-to-digital-converting the constant envelope modulation signal.

2. The circuit according to claim 1, wherein the first extractor extracts a plurality of first samples,
   the second extractor extracts a plurality of second samples, and
   the first phase calculator calculates the first phase change of the digital signal over the first natural number multiple of the predetermined period by performing the operation based on the inverse tangent function using an average value of the plurality of first samples and an average value of the plurality of second samples.

3. The circuit according to claim 1, further comprising:
   a third time shifter that adds or subtracts a second natural number multiple of the predetermined period to or from the first time to obtain a third extraction timing;
   a third extractor that extracts a third sample corresponding to the third extraction timing from the digital signal;
   a fourth time shifter that adds or subtracts the second natural number multiple of the predetermined period to or from the second time to obtain a fourth extraction timing;
   a fourth extractor that extracts a fourth sample corresponding to the fourth extraction timing from the digital signal; and
   a second phase calculator that calculates a second phase change of the digital signal over the second natural number multiple of the predetermined period by performing the operation based on the inverse tangent function using the third sample and the fourth sample,
   wherein the frequency error calculator calculates a first candidate value of the frequency error using the first phase change and the offset frequency, calculates a second candidate value of the frequency error using the second phase change and the offset frequency, and calculates the frequency error based on the first candidate value and the second candidate value.

4. The circuit according to claim 3, wherein the first extractor extracts a plurality of first samples,
   the second extractor extracts a plurality of second samples,
   the third extractor extracts a plurality of third samples,
   the fourth extractor extracts a plurality of fourth samples,
   the first phase calculator calculates the first phase change of the digital signal over the first natural number multiple of the predetermined period by performing the operation based on the inverse tangent function using an average value of the plurality of first samples and an average value of the plurality of second samples, and
   the second phase calculator calculates the second phase change of the digital signal over the second natural number multiple of the predetermined period by performing the operation based on the inverse tangent function using an average value of the plurality of third samples and an average value of the plurality of fourth samples.

5. The circuit according to claim 1, wherein the iteration of the known symbol includes a preamble signal.

6. A receiver comprising:
   the circuit according to claim 1; and
   the local oscillator.

7. An auto frequency control circuit for controlling an oscillation frequency of a local oscillator that generates a local signal, the circuit comprising:
- an offset signal generator that generates an offset signal representing an offset frequency to be set in the local oscillator such that a phase of a digital signal corresponding to iteration of a known symbol having a predetermined period monotonously increases with respect to a time, and feeds back the offset signal to the local oscillator;
- a storage that stores an LUT (Look Up Table) in which a plurality of combinations of a frequency difference between a constant envelope modulation signal and the local signal and an index parameter corresponding to a value of one of a monotone increasing function and a monotone decreasing function to the frequency difference are registered;
- an index parameter calculator that calculates a current index parameter based on the digital signal;
- a frequency difference estimator that estimates a current frequency difference corresponding to the current index parameter by searching the LUT; and
- a frequency error calculator that calculates a frequency error of the digital signal using the current frequency difference and the offset frequency, and feeds back the frequency error to the local oscillator,
- wherein the digital signal is generated by down-converting the constant envelope modulation signal using the local signal and analog-to-digital-converting the constant envelope modulation signal.

8. The circuit according to claim 7, wherein the index parameter calculator comprises:
- a numerator calculator that calculates a numerator term by integrating a $2n^{th}$-power (n is an arbitrary natural number) value of a second-order derivative of the digital signal;
- a denominator calculator that calculates a denominator term by integrating a $2n^{th}$-power value of the digital signal; and
- a divider that divides the numerator term by the denominator term to obtain the index parameter.

9. The circuit according to claim 7, further comprising:
- a calibration signal generating circuit that generates a calibration signal that simulates the iteration of the known symbol and outputs the calibration signal to the index parameter calculator; and
- an LUT generating circuit that generates the LUT by registering, in the LUT, a combination of the index parameter calculated based on the calibration signal and a frequency difference set in the calibration signal.

10. The circuit according to claim 9, wherein the LUT generating circuit registers, in the LUT, an average value of index parameters calculated by the index parameter calculator by changing an initial phase difference set in the calibration signal from 0 to $2\pi$.

11. An auto frequency control circuit for controlling an oscillation frequency of a local oscillator that generates a local signal, the circuit comprising:
- an offset signal generator that generates an offset signal representing an offset frequency to be set in the local oscillator such that a phase of a digital signal corresponding to iteration of a known symbol having a predetermined period monotonously increases with respect to a time, and feeds back the offset signal to the local oscillator;
- a peak time detector that detects, from the digital signal, a first time at which the digital signal exhibits one of a maximal value and a minimal value;
- a first time shifter that adds or subtracts a first natural number multiple of the predetermined period to or from the first time to obtain a first extraction timing;
- a first extractor that extracts a first sample corresponding to the first extraction timing from the digital signal;
- a zero-crossing time detector that detects, from the digital signal, a second time at which the digital signal exhibits one of a positive zero-crossing and a negative zero-crossing;
- a second time shifter that adds or subtracts the first natural number multiple of the predetermined period to or from the second time to obtain a second extraction timing;
- a second extractor that extracts a second sample corresponding to the second extraction timing from the digital signal;
- a first phase calculator that calculates a first phase change of the digital signal over the first natural number multiple of the predetermined period by performing an operation based on an inverse tangent function using the first sample and the second sample;
- a first frequency error calculator that calculates a first frequency error of the digital signal using the first phase change and the offset frequency;
- a storage that stores an LUT (Look Up Table) in which a plurality of combinations of a frequency difference between a constant envelope modulation signal and the local signal and an index parameter corresponding to a value of one of a monotone increasing function and a monotone decreasing function to the frequency difference are registered;
- an index parameter calculator that calculates a current index parameter based on the digital signal;
- a frequency difference estimator that estimates a current frequency difference corresponding to the current index parameter by searching the LUT; and
- a second frequency error calculator that calculates a second frequency error of the digital signal using the current frequency difference and the offset frequency; and
- a calculation error correction circuit that feeds back the first frequency error to the local oscillator if an absolute value of a difference between the first frequency error and the second frequency error is not larger than a threshold, and feeds back a corrected frequency error obtained by adding or subtracting a correction value to or from the first frequency error to the local oscillator if the absolute value of the difference is larger than the threshold,
- wherein the digital signal is generated by down-converting the constant envelope modulation signal using the local signal and analog-to-digital-converting the constant envelope modulation signal.

* * * * *